United States Patent
Ouyang et al.

(10) Patent No.: US 9,064,674 B2
(45) Date of Patent: Jun. 23, 2015

(54) LOW TEMPERATURE PLASMA PROBE AND METHODS OF USE THEREOF

(71) Applicant: Purdue Research Foundation, West Lafayette, IN (US)

(72) Inventors: Zheng Ouyang, West Lafayette, IN (US); Jason David Harper, Lafayette, IN (US); Nicholas Alan Charipar, Batavia, IN (US); Robert Graham Cooks, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 14/277,191

(22) Filed: May 14, 2014

(65) Prior Publication Data

US 2014/0299764 A1     Oct. 9, 2014

Related U.S. Application Data

(63) Continuation of application No. 14/010,130, filed on Aug. 26, 2013, now Pat. No. 8,772,710, which is a continuation of application No. 12/863,801, filed as application No. PCT/US2009/033760 on Feb. 11, 2009, now Pat. No. 8,519,354.

(60) Provisional application No. 61/028,035, filed on Feb. 12, 2008.

(51) Int. Cl.
*H01J 49/26* (2006.01)
*H01J 37/32* (2006.01)
(Continued)

(52) U.S. Cl.
CPC .. *H01J 37/32009* (2013.01); *Y10T 436/203332* (2015.01); *Y10T 436/145555* (2015.01);
(Continued)

(58) Field of Classification Search
CPC ............ H05H 1/24; H05H 1/30; H05H 1/46; H05H 1/2406; H05H 2001/2412; H05H 2001/466; H05H 2001/4697; H05H 2240/10; H05H 2240/20; H01J 49/142; H01J 27/022; H01J 49/02; H01J 49/105; H01J 49/12; H01J 37/32009; H01J 2237/0044; H01J 37/00; H01J 37/32541; H01J 37/3255; H01J 49/0013; H01J 49/0027; H01J 49/10; H01J 49/26
USPC ...................... 250/282, 288, 423 R
See application file for complete search history.

(56) References Cited

U.S. PATENT DOCUMENTS 5,798,146 A * 8/1998 Murokh et al. ............... 427/458
5,961,772 A * 10/1999 Selwyn .................... 156/345.39
(Continued)

OTHER PUBLICATIONS

Ratcliffe et al., "Surface Analysis under ambient Conditions Using Plasma-Assisted Desorption/Ionization Mass spectrometry", Anal. Chem. 2007, 6094-6101.*
(Continued)

*Primary Examiner* — Michael Logie
(74) *Attorney, Agent, or Firm* — Brown Rudnick LLP; Adam M. Schoen

(57) ABSTRACT

The present invention generally relates to a low temperature plasma probe for desorbing and ionizing at least one analyte in a sample material and methods of use thereof. In one embodiment, the invention generally relates to a low temperature plasma probe including: a housing having a discharge gas inlet port, a probe tip, two electrodes, and a dielectric barrier, in which the two electrodes are separated by the dielectric barrier, in which application of voltage from a power supply generates a low temperature plasma, and in which the low temperature plasma is propelled out of the discharge region by the electric field and/or the discharge gas flow.

19 Claims, 12 Drawing Sheets

(51) Int. Cl.
  *H01J 37/00* (2006.01)
  *H05H 1/24* (2006.01)
  *H05H 1/30* (2006.01)
  *H01J 49/10* (2006.01)
  *H01J 49/14* (2006.01)
  *H01J 27/02* (2006.01)
  *H01J 49/02* (2006.01)

(52) U.S. Cl.
  CPC ...... *Y10T436/173076* (2015.01); *Y10T 436/24* (2015.01); *Y10T 436/147777* (2015.01); *H01J 2237/0044* (2013.01); *H01J 37/00* (2013.01); *H05H 1/24* (2013.01); *H05H 1/30* (2013.01); *H05H 2240/10* (2013.01); *H05H 2240/20* (2013.01); *H01J 49/105* (2013.01); *H01J 49/142* (2013.01); *H01J 27/022* (2013.01); *H01J 49/02* (2013.01)

(56) References Cited

U.S. PATENT DOCUMENTS

| | | | |
|---|---|---|---|
| 6,465,964 B1 * | 10/2002 | Taguchi et al. | 315/111.21 |
| 6,482,476 B1 * | 11/2002 | Liu | 427/535 |
| 7,651,585 B2 * | 1/2010 | Yoon et al. | 156/345.43 |
| 7,667,197 B2 * | 2/2010 | Lin et al. | 250/288 |
| 8,328,982 B1 * | 12/2012 | Babayan et al. | 156/345.43 |
| 8,519,354 B2 * | 8/2013 | Charipar et al. | 250/423 R |
| 8,772,710 B2 * | 7/2014 | Ouyang et al. | 250/288 |
| 8,803,084 B2 * | 8/2014 | Nishimura et al. | 250/288 |
| 2007/0108910 A1 * | 5/2007 | Eden et al. | 313/631 |
| 2007/0114389 A1 * | 5/2007 | Karpetsky et al. | 250/288 |
| 2008/0193330 A1 * | 8/2008 | Hotta et al. | 422/23 |
| 2008/0277579 A1 * | 11/2008 | Lin et al. | 250/288 |
| 2009/0065485 A1 * | 3/2009 | O'Neill et al. | 219/121.52 |
| 2009/0188626 A1 * | 7/2009 | Lu et al. | 156/345.35 |
| 2010/0019677 A1 * | 1/2010 | Kitano et al. | 315/111.21 |

OTHER PUBLICATIONS

Shakhashiri, Chemical of the week, Nov. 2007.*
Zhang et al. "A novel cold plasma jet generated by atmospheric dielectric barrier capillary discharge", Thin Solid Films 506-507 (2006).*
Laroussi et al., "Arc-Free Atmospheric Pressure Cold Plasma Jets: A Review", Plasma Process. Polym. 2007, 4, 777-788.*

* cited by examiner

LOW TEMPERATURE PLASMA PROBE AND METHODS OF USE THEREOF

RELATED APPLICATION

The present application is a continuation of U.S. nonprovisional application Ser. No. 14/010,130, filed Aug. 26, 2013, which is a continuation of U.S. nonprovisional application Ser. No. 12/863,801, filed Nov. 5, 2010, now U.S. Pat. No. 8,519,354, which is a 35 U.S.C. §371 national phase application of PCT/US2009/033760, filed Feb. 11, 2009, which PCT application claims the benefit of and relates to U.S. provisional patent application Ser. No. 61/028,035, filed Feb. 12, 2008, the content of each of which is incorporated herein by reference in its entirety.

GOVERNMENT SUPPORT

This invention was made with government support under 2007-ST-069-TSL001 awarded by Department of Homeland Security. The government has certain rights in the invention.

TECHNICAL FIELD

The present invention generally relates to a low temperature plasma probe for desorbing and ionizing at least one analyte in a sample material and methods of use thereof.

BACKGROUND

In the field of analytical chemistry, the demand for direct sampling under ambient conditions has increased, and this has led to the development of a variety of ambient ionization sources. Ambient ionization sources ionize analytes in the respective ambient environment (in-situ) with no intrinsic requirement for sample preparation. This advantage allows real-time, on-site detection, saving time and resources.

Electrospray based ambient ionization sources offer significant potential benefits over traditional vacuum based analytical techniques. In particular, desorption electrospray ionization (DESI) allows the examination of analytes directly from ambient surfaces, eliminating the requirement for sample preparation prior to analysis (Takats, Z.; Wiseman, J. M.; Gologan, B.; Cooks, R. G., Science 2004, 306, 471-473). DESI desorbs and ionizes compounds from surfaces by directing a pneumatically assisted electrospray at the surface of interest. Extractive electrospray ionization (EESI) has been shown to allow the analysis of liquid samples such as undiluted milk, urine, and other complex mixtures without sample preparation (Chen, H.; Venter, A.; Cooks, R. G., Chemical Communications 2006, 2042-2044). Electrospray-assisted laser desorption/ionization (ELDI) combines laser desorption with post-ionization by electrospray and has been applied to the rapid analysis of solids (Shiea, J.; Huang, M.-Z.; HSu, H.-J.; Lee, C.-Y.; Yuan, C.-H.; Beech, I.; Sunner, J., Rapid Communications in Mass Spectrometry 2005, 19, 3701-3704).

A problem with the above electrospray based ambient ionization sources is the requirement of an electrospray solvent and high velocity auxiliary gas flow, or additional laser device, for operation of the sources. The need for a continuous supply of solvents and gases, as well as the associated containers and disposal services, makes electrospray based methods less than ideal for in situ applications.

There is an unmet need for more simpler ambient ionization sources which do not require expendables like solvents, and methods of using these sources to analyze sample materials.

SUMMARY

The invention herein overcomes drawbacks associated with electrospray or laser based ambient ionization techniques by utilizing a low temperature plasma. Unlike electrospray or laser based ambient ionization sources, plasma sources do not require an electrospray solvent, auxiliary gases and lasers, saving costs, space, weight, personnel time and resources.

One type of plasma that is of interest is the ambient, low temperature plasma (LTP). LTP can be characterized as a non-equilibrium plasma having high energy electrons, with relatively low kinetic energy but reactive ions and neutrals; the result is a low temperature ambient plasma that can be used to desorb and ionize analytes from surfaces and produce molecular ions or fragment ions of the analytes. A distinguishing characteristic of the LTP, in comparison with high temperature (equilibrium) plasmas, is that the LTP does not breakdown the molecules into atoms or small molecular fragments, so the molecular information is retained in the ions produced. LTP ionization sources have the potential to be small in size, consume low power and gas (or to use only ambient air) and these advantages can lead to reduced operating costs. In addition to cost savings, LTP based ionization methods have the potential to be utilized with portable mass spectrometers for real-time analytical analysis in the field (Gao, L.; Song, Q.; Patterson, G. E.; Cooks, D. Ouyang, Z., Anal. Chem. 2006, 78, 5994-6002; Mulligan, C. C.; Talaty, N.; Cooks, R. G., Chemical Communications 2006, 1709-1711; and Mulligan, C. C.; Justes, D. R.; Noll, R. J.; Sanders, N. L.; Laughlin, B. C.; Cooks, R. G., The Analyst 2006, 131, 556-567).

Low temperature plasma ionization methods can be applied to analyze a wide variety of compounds including explosives (Na, N.; Zhang, C.; Zhao, M.; Zhang, S.; Yang, C.; Fang, X.; Zhang, X., Journal of Mass Spectrometry 2007, 42, 1079-1085 and Cody, R. B.; Laramee, J. A.; Durst, H. D., Anal. Chem. 2005, 77, 2297-2302), pharmaceutical pills (Ratcliffe, L. V.; Rutten, M.; Barrett, D. A.; Whitemore, T.; Seymour, D.; Greenwood, C.; Aranda-Gonzalvo, Y.; Robinson, S.; McCoustra, M., Anal. Chem. 2007, 79, 6094-6101), bodily fluids (Cody, R. B.; Laramee, J. A.; Durst, H. D., Anal. Chem. 2005, 77, 2297-2302) and amino acids (Na, N.; Zhao, M.; Zhang, S.; Yang, C.; Zhang, X., Journal of the American Society for Mass Spectrometry 2007, 18, 1859-1862).

The plasma ionization source described herein can operate at both low pressure or at ambient atmospheric pressure. The plasma ionization source described herein is small, portable, lightweight and consumes low power. This source is able to ionize samples in gaseous, liquid, and solid forms with the use of any type of discharge gas (for example He, $N_2$, Ar, air, etc) in-situ. The plasma ionization source described herein can produce molecular or fragment ions from analytes. The plasma source described herein creates a LTP that is gentle enough to analyze compounds present on human skin, while also containing highly active particles which can to ionize and desorb almost any molecular analyte from any surface. The ambient temperature of the LTP is low, but the energy (kinetic, internal, or reactive, viz. potential) of some particles in the LTP is high.

An aspect of the present invention provides a low temperature plasma probe including: a housing having a discharge gas inlet port, a probe tip, two electrodes, and a dielectric barrier, in which the two electrodes are separated by the dielectric barrier, and in which application of voltage from a power supply generates an electric field and a low temperature plasma, in which the electric field, or gas flow, or both, propel the low temperature plasma out of the probe tip. The ionization source of the probe described herein is based upon a dielectric barrier discharge (DBD; Kogelschatz, U., Plasma Chemistry and Plasma Processing 2003, 23, 1-46). Dielectric barrier discharge is achieved by applying a high voltage signal, for example an alternating current, between two electrodes separated by a dielectric barrier. A non-thermal, low power, plasma is created between the two electrodes, with the dielectric limiting the displacement current. This plasma contains reactive ions, electrons, radicals, excited neutrals, and metastable species in the ambient environment of the sample which can be used to desorb/ionize molecules from a solid sample surface as well as ionizing liquids and gases. The plasma can be extracted from the discharge region and directed toward the sample surface with the force by electric field, or the combined force of the electric field and gas flow.

In certain embodiments, the probe further includes a power supply. The power supply can provide direct current or alternating current. In certain embodiments, the power supply provides an alternating current. In certain embodiments, a discharge gas is supplied to the probe through the discharge gas inlet port, and the electric field and/or the discharge gas propel the low temperature plasma out of the probe tip. The discharge gas can be any gas. Exemplary discharge gases include helium, compressed or ambient air, nitrogen, and argon. In certain embodiments, the dielectric barrier is composed of an electrically insulating material. Exemplary electrically insulating materials include glass, quartz, ceramics and polymers. In other embodiments, the dielectric barrier is a glass tube that is open at each end. In other embodiments, varying the electric field adjusts the energy and fragmentation degree of ions generated from the analytes in a sample.

Another aspect of the invention provides a low temperature plasma probe including: a housing having a discharge gas inlet port and a tube that is open at each end, in which at least a portion of the tube extends outside of the housing; a first electrode that extends into the housing and into a proximal end of the tube; a second electrode in contact with an exterior portion of the tube; a power supply; in which application of the voltage from the power supply generates and electric field and a low temperature plasma, in which the electric field propels the low temperature plasma out of a distal end of the tube.

In certain embodiments, the first electrode is grounded and the second electrode receives voltage from the power supply, and application of the voltage from the power supply to the second electrode generates the electric field and the low temperature plasma. In other embodiments, the second electrode is grounded and the first electrode receives voltage from the power supply, and application of the voltage from the power supply to the first electrode generates the electric field and the low temperature plasma.

In certain embodiments, a discharge gas is supplied to the probe through the discharge gas inlet port, and the discharge gas and the electric field propel low temperature plasma out of the distal end of the tube. In other embodiments, the tube is composed of an electrically insulating material, such as glass, quartz, ceramics and polymers. In certain embodiments, the first electrode is axially centered within the tube. The first and second electrodes can be composed of any electrically conducting material. In certain embodiments, the first electrode is stainless steel. In other embodiments, the second electrode is copper tape.

Another aspect of the invention provides a system for analyzing a sample material including: an apparatus for generating a low temperature plasma and directing the low temperature plasma onto a sample material to interact with the sample and generate ions of at least one analyte in the sample; and a mass analyzer. In certain embodiments, the system further includes a computer operably connected to the system. In certain embodiments, the system further includes a corona discharge needle. In certain embodiments, the system further includes a mesh electrode.

In certain embodiments, the mass analyzer is a mass spectrometer or an ion mobility spectrometer. In other embodiments, the system further includes a stage for holding the sample material. In certain embodiments, the apparatus for generating low temperature plasma and the mass analyzer are coupled to each other. In alternative embodiments, the apparatus for generating low temperature plasma and the mass analyzer are uncoupled, and in which the mass analyzer is located in sufficiently close proximity to the sample to collect ions of at least one analyte in the sample produced by the apparatus for generating low temperature plasma.

In certain embodiments, the sample material is of at least one state selected from the group consisting of: solid phase, liquid phase, and gas phase. In other embodiments, the sample material is of biological origin. In other embodiments, the sample material is an industrial work piece or pharmaceutical product or ingredient. In other embodiments, the sample material is selected from the group consisting of a food or food ingredient, a toxin, a drug, an explosive, a bacterium, or a biological tissue.

Another aspect of the invention provides a method for desorbing and ionizing an analyte in a sample material with molecular ions or fragment ions generated for mass analysis. In certain embodiments, the ratio between the molecular and fragment ions may be adjusted by varying the electric field and/or discharge gas type and flow rate. In certain embodiments, the ratio between the molecular and fragment ions may be adjusted by adjusting the overlap of the counter electrodes that are used to establish the electric field.

Another aspect of the invention provides a method for desorbing and ionizing an analyte in a sample material including directing a low temperature plasma onto a surface of a sample material to interact with the surface and desorb the analyte. In certain embodiments, the method further includes adding a reagent in the low temperature plasma to reactively desorb the analyte from a surface. In certain embodiments, the method further includes adding a reagent into the low temperature plasma to generate reagent ions that reactively desorb the analyte from a surface. In certain embodiments, the method further includes adding a reagent to the air in the vicinity of a sample surface to generate primary ions that reactively desorb the analyte from a surface. In certain embodiments, the method further includes adding a reagent to a surface containing the sample, wherein the reagent is desorbed by the low temperature plasma to generate reagent ions, and the reagent ions subsequently reactively desorb the analyte from the sample on the surface. In certain embodiments, the method further includes adding a reagent that interacts as neutrals with the ions and sample analytes.

In certain embodiments, the low temperature plasma that contacts the surface includes electrons, ions, radicals, and excited neutrals. In certain embodiments, the low temperature plasma contacts the sample material at substantially atmospheric pressure. In certain embodiments, the low temperature plasma contacts the sample material in an ambient environment. In certain embodiments, the sample is a biological material.

In other embodiments, the low temperature plasma is configured to impinge on a spot on the sample and the spot is scanned to provide desorbed ions representing different parts of the sample. The spot can be mechanically or electrically otherwise restricted in size, for example the spot can be restricted to a few microns. In a related embodiment, the sample and spot are moved relative to one another to produce ions of the analyte in the sample material from different locations of the sample material and the produced ions are associated with the location of the spot. In another related embodiment, the locations of the spots are used to form an image of the analyte ions on the sample.

In certain embodiments, the sample is on a solid or flexible surface. In certain embodiments, the sample is a liquid. In other embodiments, the sample is in the gas phase. In certain embodiments, the sample is analyzed using low temperature plasma at ambient temperature. In certain embodiments, the sample is independently heated during desorption using the low temperature plasma. In certain embodiments, the heating is achieved by focusing plasma onto a small area of the sample surface. In certain embodiments, the sample surface is conductive. In certain embodiments, the heating of the sample is achieved by using additional heating elements.

Another aspect of the invention provides a method of analyzing a sample material including: directing a low temperature plasma spray onto a surface of a sample material to interact with the surface and desorb and ionize the analyte; and collecting and analyzing the analyte ions.

In certain embodiments, the analyte ions are analyzed by a mass spectrometer or ion mobility spectrometer. In other embodiments, the sample material is sprayed at a plurality of locations and the analyte ions are mass analyzed at each location. In other embodiments, mass analysis of the sample material at each location is used to develop an image of the distribution of analyte masses at the surface of the sample.

Another aspect of the invention provides a method of extracting low temperature plasma from a dielectric barrier including: supplying a compressed gas to a dielectric barrier discharge to propel low temperature plasma from the dielectric barrier discharge onto a surface. Ino related embodiment, the method further includes using the propelled low temperature plasma for surface analysis of a sample material.

Another aspect of the invention provides a method of collecting a sample material including: directing a low temperature plasma onto a surface of a sample material to interact with the surface and desorb and ionize at least one analyte from the sample; and collecting and storing the analyte ions. In certain embodiments, the method further includes analyzing the stored analyte ions. In certain embodiments, the analyte ions are analyzed by a mass spectrometer or an ion mobility spectrometer.

BRIEF DESCRIPTION OF THE DRAWINGS

FIG. 2A shows a mass spectrum recorded with He as the discharge gas. FIG. 2B shows a mass spectrum recorded with $N_2$ as the discharge gas.

FIG. 5A shows a mass spectrum recorded with He as the discharge gas (inset $MS^2$ data). FIG. 5B shows a mass spectrum recorded with air as discharge gas. FIG. 5C is the MS spectrum of 500 pg TNT. FIG. 5D is the $MS^2$ spectrum of ions of m/z 227 (500 pg TNT). FIG. 5E is the $MS^2$ spectrum of ions of m/z 226 (5 pg TNT).

FIG. 6, panel A shows the $MS^2$ and $MS^3$ data correlating with known fragments of atrazine.

FIG. 8, panel B is a mass spectrum obtained from separate deposits (1 cm distance apart) on glass of each of phenylboronic acid (17 μg deposited) and catechol (8 μg deposited).

FIG. 15, panel A shows the $MS^2$ data correlating with known fragments of nicotine.

DETAILED DESCRIPTION

Figure 1:
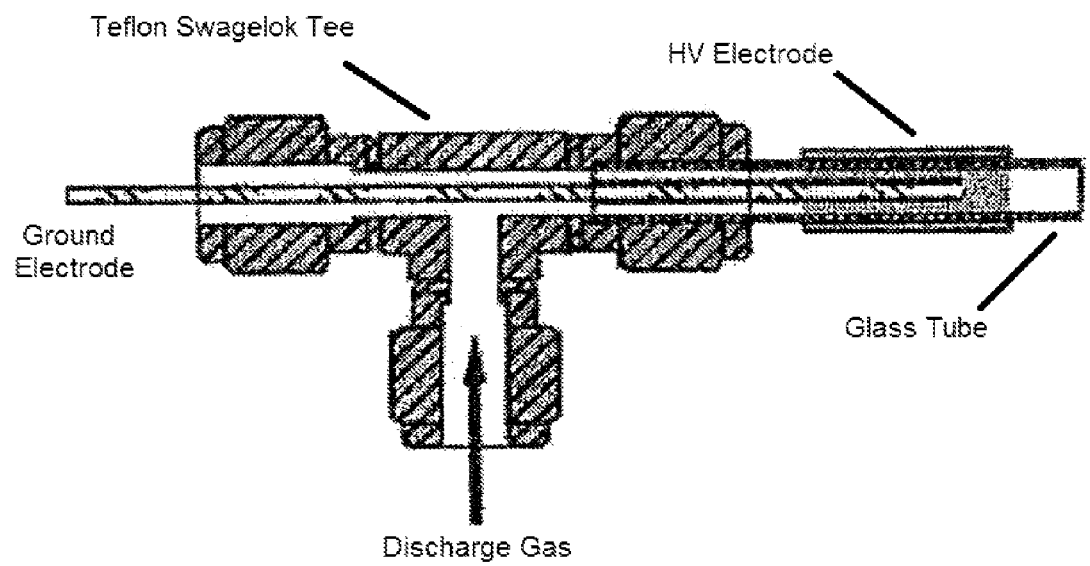
FIG. 1 is a picture showing an embodiment of a low temperature plasma (LTP) probe of the present invention.

Direct desorption ionization is of great interest due to the advantage of generating gas phase ions directly from condensed phase samples for mass analysis, which allows the elimination of complex procedures usually required for sample preparation and leads to the development of in-situ analysis based on mass spectrometry.

Recently developed desorption ionization methods include methods in which the sample is present in the open ambient atmosphere. Examples are desorption electrospray ionization (Takats, Z.; Wiseman, J. M.; Gologan, B.; Cooks, R. G. Mass Spectrometry Sampling under Ambient Conditions with Desorption Electrospray Ionization. Science 2004, 306, 471-473), direct analysis in real time (Cody, R. B.; Laramee, J. A.; Durst, H. D. Versatile New Ion Source for the Analysis of Materials in Open Air under Ambient Conditions. Anal. Chem. 2005, 77, 2297-2302), atmospheric pressure dielectric barrier discharge ionization (Na, N.; Zhao, M. X.; Zhang, S. C.; Yang, C. D.; Zhang, X. R. Development of a Dielectric Barrier Discharge Ion Source for Ambient Mass Spectrometry. Journal of the American Society for Mass Spectrometry 2007, 18, 1859-1862), electrospray-assisted laser desorption/ionization (Shiea, J.; Huang, M. Z.; Hsu, H. J.; Lee, C. Y.; Yuan, C. H.; Beech, I.; Sunner, J. Electrospray-Assisted Laser Desorption/Ionization Mass Spectrometry for Direct Ambient Analysis of Solids. Rapid Commun. Mass Spectrom. 2005, 19, 3701-3704), and atmospheric-pressure solids analysis probe (McEwen, C. N.; McKay, R. G.; Larsen, B. S. Analysis of Solids, Liquids, and Biological Tissues Using Solids Probe Introduction at Atmospheric Pressure on Commercial Lc/Ms Instruments. Analytical Chemistry 2005, 77, 78267831).

Some of these methods use active species generated in plasmas for chemical desorption. A direct current (DC) discharge plasma sustained with He at atmospheric pressure has been developed for desorption ionization of solids and liquids (Andrade, F. J.; Hiefije, G. M.; Ray, S.; Schilling, G. D.; Wetzel, W. C.; Webb, M. R.; Gamez, G. G.; Koppenaal, D. W.; Barinaga, C. J.; Sperline, R. P.; Denton, M. B.; I V, J. H. B., Seattle, Wash., May 28-Jun. 1 2006; ThOB pm 02:50; Andrade, F. J.; Ray, S. J.; Webb, M. R.; Hieftje, G. M., Indianapolis, Ind., Jun. 3-7 2007; TOF pm 2:50; Andrade, J.; Wetzel, W. C.; Chan, G. C. Y.; Webb, M. R.; Gamez, G.; Ray, S. J.; Hieftje, G. M. A New, Versatile, Direct-Current Helium Atmospheric-Pressure Glow Discharge. Journal of Analytical Atomic Spectrometry 2006, 21, 1175-1184). An AC direct discharge plasma source has been used for chemical analysis (Ratcliffe, L. V.; Rutten, F. T. M.; Barrett, D. A.; Whitmore, T.; Seymour, D.; Greenwood, C.; Aranda-Gonzalvo, Y.; Robinson, S.; McCoustrat, M. Surface Analysis under Ambient Conditions Using Plasma-Assisted Desorption/Ionization Mass Spectrometry. Analytical Chemistry 2007, 79, 6094-6101). A plasma pen using a pulsed DC has also been developed (Laroussi, M.; Lu, X. Room-Temperature Atmospheric Pressure Plasma Plume for Biomedical Applications. Applied Physics Letters 2005).

These prior art desorption ionization sources are significantly different from plasma ion sources used for inductively coupled plasma mass spectrometry (ICP-MS), because these prior art sources use high temperature plasmas and so cannot represent molecular structures of the resulting ions. Further, the LTP probes of the present invention can generate low temperature plasmas at atmospheric pressure, instead of using decreased pressure as in glow discharge (GD) ionization (Mcluckey, S. A.; Glish, G. L.; Asano, K. G.; Grant, B. C.; Atmospheric Sampling Glow-Discharge Ionization Source for the Determination of Trace Organic-Compounds in Ambient Air, Analytical Chemistry 1988, 60, 2220-2227).

Differences between the LTP probes of the invention and DAPCI center on the nature of the discharge and support gas, while there are major differences in device configuration, discharge, and temperatures from those used in DART, PADI, and the FA-APGD sources compared to the LTP probes of the invention. LTP probes of the invention also differ from dielectric barrier methods because use the LIP probe configuration of the invention allows direct interaction of the plasma with the sample, a distinguishing feature of the LTP probe. The LIT probes of the invention are further differentiated from dielectric barrier discharge ion sources because of the configuration of the probes, in particular, LTP probes of the invention are configured with counter electrodes within the probe. Such a configuration allows for the analysis of any type of object (fixed, small, large, etc.) without having to place the sample between two counter electrodes, as is required with dielectric barrier discharge ion sources. Table 1 summarizes the features of the ambient sampling ionization methods utilizing plasmas.

TABLE 1

Ambient ionization sources using low temperature plasmas

| Source | Discharge Type | Sample Exposed to Discharge? | Temperature at Sample Surface (C. °) | Discharge Gas | Gas Flow Rate (L/min) | Voltage and Power (used in demonstration) |
|---|---|---|---|---|---|---|
| LTP Probe | AC DBD[a] | N | 30 | He, Ar, $N_2$, Air | <0.4 | AC, 2-5 kHz, 2.5-5 $kV_{pp}$, <3 W |
| DBDI | AC DBD | Y | N/A | He, Air | <0.2 | AC, 20.3 kHz, 3.5-4.5 $kV_{pp}$, 5-30 W |
| PADI | RF Discharge | Y | N/A | He | >0.7 | RF, 13.56 MHz, 0.3 $kV_{pp}$, <5 W |
| DART | DC Discharge | N | 250-350 | He, $N_2$ | 1 | DC, +1-5 kV [b] |
| FA-APGD | DC Discharge | N | 200 | He | 0.9-1.5 | DC, −500 to −700 V, 3-20 W |

[a] DBD: dielectric barrier discharge
[b] Additional heating is applied

In a low temperature plasma (LTP) probe of the present invention, a dielectric barrier discharge is used as the plasma source and active species are extracted from the plasma while it is scanned across a surface of interest. Dielectric-barrier discharge refers to an electrical discharge between two electrodes separated by an insulating dielectric barrier. The process uses high voltage, for example alternating current. The voltage can be at lower RF frequencies or can be at microwave levels. Common dielectric materials can be any electrically insulating material. Exemplary materials include glass, quartz, ceramics and polymers.

Low temperature plasma (LTP) is characterized as having high energy electrons, with fairly low energy ions and neutrals. The use of an LTP probe for sampling can result in a temperature on the sampled surface ranging from ambient temperature to about 45.degree. C., from about 10° C. to about 40° C., or from about 15° C. to about 35° C. Exemplary temperatures include about 5° C., about 8° C., about 15° C., about 17° C., about 19° C., about 20° C., about 25° C., about 27° C., about 30° C., about 35° C., about 40° C., or about 45° C.

The sample surface can also be heated to above 250° C. to allow for an improvement of the desorption efficiency using an LTP probe. The heating of the surface can be done by using additional heater or by putting the sample on a conductive surface, for which the plasma can be focused onto a small area to cause the increase in surface temperature. High temperatures can be achieved by adjusting the electrode positions and the gas flow, as well as the voltage, dielectric barrier, etc. In certain embodiments, higher temperature is used to facilitate desorption, although this temperature is still nowhere close to that of the equilibrium plasma.

At the surface, the active species generate gas phase ions of surface constituents for mass spectrometric analysis. In certain embodiments, the low temperature plasma probe can be formed by an outer electrode wrapped around a glass tube (dielectric barrier) and a rod electrode inserted coaxially inside the tube. An AC current of, for example, 5-10 kV at a frequency of, for example, 1-3 kHz, is applied between the electrodes to facilitate a dielectric barrier discharge (DBD) with gases such as He, Ar, $N_2$ or air, at a flow rate as low as 0.8 mL/min. The power consumption of the LTP probe is about 1-3 W.

Without being limited by any particular theory or mechanism of action, it is believed that the transfer of analytes from the condensed phase to the gas phase with or without being ionized may be the result of chemical sputtering (Vincenti, M.; Cooks, R. G. Desorption Due to Charge Exchange in Low Energy Collisions of Organofluorine ions at Solid Surfaces, Org. Mass Spectrom. 1998, 23 (317-326)). This is a type of ion-stimulated desorption of ions; alternative possibilities include neutral desorption by ion impact with subsequent ionization, electron stimulated ion desorption and electron stimulated neutral desorption with subsequent ionization. There are other possibilities too. There are possibly four types of primary species generated in an LTP that are chemically active: electrons, ions, radicals, and excited neutrals (Kogelschatz, U. Dielectric-barrier Discharges: Their History, Discharge Physics, and Industrial Applications, Plasma Chemistry and Plasma Processing 2003, 23(2), 1-46; Stefecka, M.; Korzec, D.; Siry, M.; Imahori, Y.; Kando, M. experimental study of atmospheric pressure surface discharge in helium, science and technology of advanced materials 2001, 2(578-593); Massines, F,; Segur, P.; Gherardi, N.; Khamphan, C.; Ricard, A, Physics and chemistry in a glow dielectric barrier discharge at atmospheric pressure: diagnostics and modelling, Surface & Coatings Technology 2003, 174(8-14); and Korzec, D.; Finantu-Dinu, E. G.; Teschke, M.; Engemann, J.; Miclea, M.; Kunzc, K.; Franzke, J.; Niemax, K. Characterization of a surface barrier discharge in helium, Plasma Sources Science & Technology 2006, 15(3), 345-359). The major possible reactions are summarized in Table 2.

TABLE 2

Possible reactions in low temperature plasma induced reactions in gas phase

| | |
|---|---|
| $A_2 + e \rightarrow A_2^+ + 2e$ (Electron ionization) | $B + e \rightarrow B^*$ (Excitation) |
| $A_2 + e$ (slow) $\rightarrow A_2^-$ (Electron capture) | $A_2 + B^* \rightarrow A_2^+ + B + e$ (Eenning ionization) |
| $A_2 + B^+ \rightarrow A_2^+ + B$ (Charge transfer) | $A_2 + B^* \rightarrow 2A + B$ (Penning dissociation) |
| $A_2 + BH^+ \rightarrow A_2H^+ + B$ (Proton transfer) | |

Fast electrons, up to a few hundred eV in energy, arising from the cathode fall region can ionize molecules, forming positively charged ions and releasing a slow electron following an electron ionization mechanism (Kogelschatz, U. Dielectric-barrier Discharges: Their History, Discharge Physics, and Industrial Applications, Plasma Chemistry and Plasma Processing 2003, 23(2), 1-46; Wagatsuma, K. Emission characteristics of mixed gas plasmas in low-pressure glow discharges, Spectrochimiea Acta Part B-Atomic Spectroscopy 2001, 56(5), 465-486; Tsuchiya, M.; Kuwabara, II, Liquid Ionization Mass-Spectrometry of Nonvolatile Organic-Compounds, Analytical Chemistry 1984, 56(1), 14-19; Massines, F.; Gherardi, N.; Naude, N.; Segur, P. Glow and Townsend dielectric barrier discharge in various atmosphere, Plasma Physics and Controlled Fusion 2005, 47(B577-B588; and Wang, D, Z.; Wang, Y. H; Liu, C. S. Multipeak behavior and mode transition of a homogeneous barrier discharge in atmospheric pressure helium, Thin Solid Films 2006, 506(384-388)).

Slow electrons (~1 eV) can be captured by molecules with appropriate electron affinities, giving rise to negatively charged ions (Wagatsuma, K. Emission characteristics of mixed gas plasmas in low-pressure glow discharges, Spectrochimica Acta Part B-Atomic Spectroscopy 2001, 56(5), 465-486). Although the temperatures of ions and radicals are normally low (Kogelschatz, U. Dielectric-barrier Discharges: Their History, Discharge Physics, and Industrial Applications, Plasma Chemistry, and Plasma Processing 2003, 23(2), 1-46), as reactive chemical species they can induce complex chemical reactions by interacting with the surrounding environment through charge transfer, electron transfer, proton transfer, and the radical initiated reactions (Massines, F,; Segur, P.; Gherardi, N.; Khamphan, C,; Ricard, A, Physics and chemistry in a glow dielectric barrier discharge at atmospheric pressure: diagnostics and modelling, Surface & Coatings Technology 2003, 174(8-14); and Boutin, M.; Lesage, J.; Ostiguy, C.; Bertrand, M. J. Comparison of E1 and metastable atom bombardment ionization for the identification of polyurethane thermal degradation products, Journal of Analytical and Applied Pyrolysis 2003, 70(2), 505-517). As a result, secondary ionic species or radicals can be generated.

Excited neutrals can ionize molecules through penning ionization and also induce dissociation upon energy transfer (Korzec, D.; Finantu-Dinu, E. G.; Teschke, M.; Engemann, J.; Miclea, M.; Kunze, K.; Franzke, J.; Niemax, K. Characterization of a surface barrier discharge in helium, Plasma Sources Science & Technology 2006, 15(3), 345-359; Smith, R, L.; Serxner, D,; Hess, K. R. ASSESSMENT OF THE RELATIVE ROLE OF PENNING IONIZATION IN LOW-PRESSURE GLOW-DISCHARGES, Analytical Chemistry 1989, 6/(10), 1103-1108); Iwama, T,; Hirose, M.; Yazawa, I.; Okada, H.; Hiraoka, K, Development of sniffing atmospheric pressure penning ionization, J. Mass Spectrom. Soc. Jpn. 2006, 54(6), 227-233; Hiraoka, K.; Furuya, H.; Kambara, S.; Suzuki, S.; Hashimoto, Y.; Takamizawa, A. Atmospheric-pressure Penning ionization of aliphatic hydrocarbons, Rapid Communications in Mass Spectrometry 2006, 20(21), 3213-3222; and Hiraoka, K.; Fujimaki, S.; Kambara, S.; Furuya, H.; Okazaki, S, Atmospheric-pressure Penning ionization mass spectrometry, Rapid Communications in Mass Spectrometry 2004, 18(19), 2323-2330).

The active species, i.e., electrons, ions and metastable atoms or molecules, can be extracted over distances of >5 cm from the low power, non-thermal plasma and used to interrogate the scanned surface. The analytes on surfaces can be desorbed, ionized and subsequently analyzed using, for example, a mass spectrometer or ion mobility spectrometer.

The LTP desorption probes of the present invention have been shown to be highly sensitive, versatile and capable of sampling large surface areas as well as bulk liquid solutions. The positive and negative ions, molecular and/or fragment ions, dependent on the types of compounds, are observed with LTP desorption. The extent of fragmentation can be adjusted by the LTP conditions, such as the electric field, type of discharge gas and flow rate, etc.

The LIT probes of the present invention have been used to ionize and desorb various polar and nonpolar chemicals present on various surfaces in the liquid, gaseous, and solid phase. Exemplary chemical classes that can be desorbed and ionized by the LTP probes of the invention include drugs of abuse, explosives, pesticides, amino acids, pharmaceutical pills, metabolites, and chemical warfare agent stimulants. Surfaces include TEFLON, glass, human skin, cloth, and liquid. Detection of as little as 50 pg was achieved for TNT on TEFLON surfaces. Further, the direct analysis of active ingredients in drug tablets was demonstrated by detecting loratadine from CLARITIN tablets and fluconazole from DIFLUCAN tablets. Chemical compounds present in complex matrices, such as the nicotine in chewing tobacco and the metabolites in urine, could also be directly analyzed using the LTP probe without any sample extraction or other pretreatments.

The LTP at atmospheric pressure serves as a rich source of highly reactive species which can be used for chemical analysis. These same species can be used as a new way to probe ion chemistry. Alternatively, the probes of the invention can be used to transform an inert surface into a highly active surface which itself can be used to probe gas phase ion chemistry or to develop new reactions.

Because the temperature of the plasma expelled from the LTP is low, e.g., 15° C. to 35° C., chemicals on a human finger could be directly sampled without damaging the skin. The LTP probe can also be used for the analysis of chemicals dissolved in bulk liquid solutions. Examples herein show that atrazine and DEET dissolved in deionized water at a concentration of 100 ppb were detected by sweeping the LTP across the solution surfaces. Further, aspartic acid and oleic acid were also desorbed using the LTP probe. Abundant fragment ions from oleic acid, such as those corresponding to ionized nonanal and nonanoic acid and formally the result of cleavage at the double bond, were observed due to the reactions with ozone.

Further, the sampling of areas larger than 20 $cm^2$ by the LTP probe has been characterized by demonstrating the desorption of a 1 µg cocaine spot located at different positions within this large area, as shown in examples herein. Thus large area sampling is capable with the LTP probes of the present invention, thus making the LTP probes of the present invention of interest for high throughput screening applications such as fast screening of illicit chemicals on luggage.

The LTP probes of the invention are an ionization source that require no sample preparation prior to analysis, and are a minimally invasive analytical technique. The LTP probes can ionize and desorb analytes in the condensed, gaseous, and liquid phases. The LTP probes have been shown to analyze bulk liquids with no prior sample preparation. The LTP probes can be used with numerous discharge gases including He, $N_2$, Ar, and even air. The fact that the LTP probes work well with air provides opportunities for the combination of the LTP probes with a portable mass spectrometer, which could have significant forensic and biological applications. Low power consumption and the ability to miniaturize the driving circuit are other reasons the LTP probes are suitable for portable applications.

Unlike other LTP sources, the high voltage electrode and the discharging area of the LTP probes described herein is distant from the sample surface, allowing the safe analysis of human skin. The LTP probes have been shown to have a large surface area analysis ability (>10 $cm^2$) that could be used for rapid identification of explosives or drugs on luggage in an airport. The large surface area scanning ability along with the lenient angle dependencies allows rapid analysis of analytes in-situ, without having to maximize the parameters of the ionization source. The ability to control the energy of the plasma leaving the probe, via the inner electrode, is yet another advantage of the LTP probe. This ability could allow rapid identification of analyte molecules in real-time and provide the user with more information.

INCORPORATION BY REFERENCE

References and citations to other documents, such as patents, patent applications, patent publications, journals, books, papers, web contents, have been made throughout this disclosure. All such documents are hereby incorporated herein by reference in their entirety for all purposes.

EQUIVALENTS

The representative examples which follow are intended to help illustrate the invention, and are not intended to, nor should they be construed to, limit the scope of the invention. Indeed, various modifications of the invention and many further embodiments thereof, in addition to those shown and described herein, will become apparent to those skilled in the art from the full contents of this document, including the examples which follow and the references to the scientific and patent literature cited herein. The following examples contain important additional information, exemplification and guidance which can be adapted to the practice of this invention in its various embodiments and equivalents thereof.

EXAMPLES

A dielectric barrier discharge was used to generate a sustainable plasma at atmospheric pressure and new types of ambient ionization sources were developed to study the desorption ionization of condensed phase samples, the plasma reactions of gas phase ions and the interactions between the sprayed ions and the plasma treated surfaces and active species generated by the LTP. LIT probe (FIG. 1) was developed. An AC of 1-3 kV and 3-30 kHz was applied between the counter electrodes separated by dielectric barrier materials to generate the LTP plasma at atmospheric pressure. Various gases, including He, Ar, $N_2$ and air, were used to facilitate and sustain the discharge.

Compounds of a variety of types, including non-volatile organic compounds, amino acids, and lipids, were successfully desorbed and ionized from various matrices and surfaces using the LTP probes of the invention. The LTP probe allowed for the extraction of active LTP species and interaction of these species with samples outside the discharging area (up to 10 cm or more away). The intensity of the discharge, the temperature and other chemical properties of the desorption environment are expected to vary with the type of gas and other conditions in the LTP spray.

Solid samples can be desorbed without being part of the dielectric barrier material using this LTP probe, so minimum damage occurs to the sample and it is easy to scan any surfaces. The temperature of the LTP probe torch was low (25-30° C.) and it desorbed chemicals on a finger for mass analysis without hurting the individual, as shown in examples herein. High efficiency of desorption ionization was obtained as indicated by the fact that TNT deposited on a TEFLON surface was analyzed using a LTP probe and the spectrum recorded with a LTQ mass spectrometer indicated detection at levels lower than 50 pg.

Other significant capabilities of the LTP probe of the invention herein that have not been shown previously with other ambient desorption ionization methods (See Takats, Z.; Wiseman, J. M.; Gologan, B.; Cooks, R. G., Science 2004, 306, 471-473; Karanassios, V., Spectrochimica Acta Part B: Atomic Spectroscopy 2004, 59, 909-928; Na, N.; Zhao, M.; Zhang, S.; Yang, C.; Zhang, X., Journal of the American Society for Mass Spectrometry 2007, 18, 1859-1862; Stoffels, E.; Flikweert, A. J.; Stoffels, W. W.; Kroesen, G. M. W., Plasma Sources Science and Technology 2002, 383; and Laroussi, M.; Lu, X., Applied Physics Letters 2005, 87, N. PAG) include the direct desorption and ionization of chemicals dissolved in bulk aqueous solutions and sampling of an area larger than 20 $cm^2$. The LTP probe of the present invention was also used for direct ionization of gas phase samples.

Many other interesting chemical phenomena were observed with the LTP probes of the invention, including the intriguing ionization/desorption mechanisms and material effects on gas phase ion reactions, etc. The investigation of the chemistry in LTP and LTP induced reactions in the gas phase or with surfaces has led to the development of new methods and devices for ambient ionization and desorption ionization prior to mass spectrometry, making new functional surfaces and study of gas phase ion chemistry at atmospheric pressure.

Example 1

LTP Probe Instrumentation

The LTP probe consisted of housing (Swagelok tee) containing a glass tube (O.D.: 6.35 mm, I.D.: 3.75 mm) with an internal axially centered electrode (stainless steel, diameter: 1.57 mm) and an outer electrode (copper tape) surrounding the outside of the tube. When an alternating high voltage was applied on the outer electrode and the center electrode was grounded, a dielectric barrier discharge was formed.

A discharge gas was fed through the tube of the probe and served as the source of reagent ions, electrons, radicals, excited neutrals, and metastable species. FIG. 1 is a diagram and picture of the LTP probe instrumentation. The probe was powered by a custom built, variable frequency and voltage power supply. In the power supply, a square waveform with adjustable frequency and amplitude was generated by a digital circuit. The square waveform was then amplified using a power amplifier and an automobile engine ignition coil. The typical excitation voltage was 5 kV to 10 kV at a frequency between 2 Hz to 5 kHz. The electric field created inside the probe was dependent on the geometry of the probe, more specifically the dielectric thickness and the spacing between the inner and outer electrodes. The power supply frequency was tuned to the resonant frequency of the probe (controlled by the inductance and capacitance of the LTP probe), thereby maximizing ionization while minimizing power consumption. The power consumption of this configuration was below 3 Watts. Initially, helium was used to generate the plasma but it was soon discovered that it was possible to use compressed air, $N_2$, and Ar and still obtain high quality mass spectra.

Instead of placing the sample close to or within the discharging area for ionization, as in most cases where plasma ionization is performed, the design of the LTP probe allows the plasma species to be extracted by the combined action of the gas flow and the electric field, with a torch (visible when Ar is used as discharge gas) extending beyond the glass tube and suitable for direct surface sampling. The temperature of the surface area in contact with the sampling plasma torch was measured, using a Fluke 62 Mini IR thermometer (Fluke Corporation, Everett, Wash., USA), to be approximately 30° C., so there is no damage to the surface due to heating. Since the high voltage electrode is electrically isolated from the direct discharge region, the sample is not subjected to the possibility of electric shock. These features mean that even chemicals on a human finger can be directly analyzed using the LTP probe (as shown in Examples below). The extension of the plasma torch from the probe was controlled by adjusting the center electrode position to decrease its overlap with the outer electrode, so that the electric field along the tube axis was enhanced.

Example 2

Configuration of LTP Probe with Mass Spectrometer

Data from examples herein were obtained using a Thermo LTQ linear ion trap mass spectrometer (Thermo Scientific, San Jose, Calif., USA) tuned for optimum detection of the precursor ion of interest. Data were acquired via the instrument's Xcalibur software. LTP-MS analysis was performed in the positive and negative ion modes for the compounds studied. The instrument was set to collect spectra in the automatic gain control mode for a maximum ion trap injection time of 200 ms and 2 microscans per spectrum. The main experimental parameters used were as follows: m/z range 150-600; ion spray voltage: 4.5 kV; capillary temperature: 200.degree. C.; tube lens (V): –65 V; capillary voltage: –15 V. Tandem mass spectrometry experiments (MS/MS) were performed using collision-induced dissociation (CID) in order to confirm the presence of the particular chemicals in the studied samples. These experiments were performed using an isolation window of 1.5 (m/z units) and 25-35% collision energy (manufacturer's unit).

Example 3

Chemical Properties of LTP

Figure 2A:
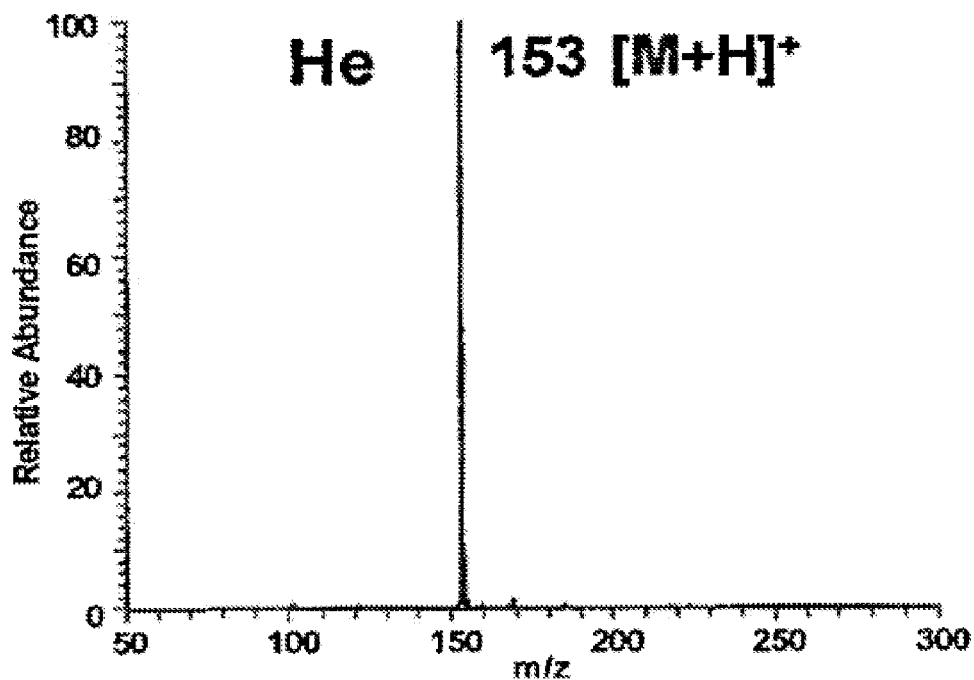
FIGS. 2A and 2B are depictions of mass spectra of methyl salicylate ionized using the LTP probe of the present invention and different discharge gases.

It has been observed that the energy involved in LTP ionization and desorption can be varied over a wide range, and that complex chemical processes occur. As an example, methyl salicylate vapor in air was ionized by LTP using He or $N_2$ as discharge gas, and different degrees of fragmentation were observed (FIGS. 2A and B).

The fragment ion m/z 121 was observed only with $N_2$ and not with He, with which the LTP might be supposed to provide metastable species of highest internal energy. This suggests that mechanisms other than penning ionization may be involved. Proton transfer with $H_3O^+$ generated by penning ionization of water in air also would not be expected to give this result. The collisions of ions at atmospheric pressure could be responsible for this, or ionization could occur via charge transfer (Leveille, V.; Coulombe, S., Plasma Sources Science and Technology 2005, 467; and Anghel, S. D.; Simon, A., Measurement Science and Technology 2007, 2642) involving $N_2^+$ or $O_2^+$ could be another hypothesis, as is known for DC plasma desorption (Kogelschatz, U., Plasma Chemistry and Plasma Processing 2003, 23, 1-46).

The relative ratio between fragment and molecular species can also be altered by adjusting the position of the center electrode of the LTP probe (FIG. 1), which ultimately changes the electric field and the discharge intensity inside the LTP source. Fragmentation was also observed for desorption ionization of solids from surfaces, as in the detection of TNT from a TEFLON surface (See Examples below), and the relative ion abundances were also tunable with LTP conditions. Generation of fragment ions added complexity to the spectra recorded in the analysis of complex mixtures and also provided information on chemical structures of the analytes.

Figure 3:
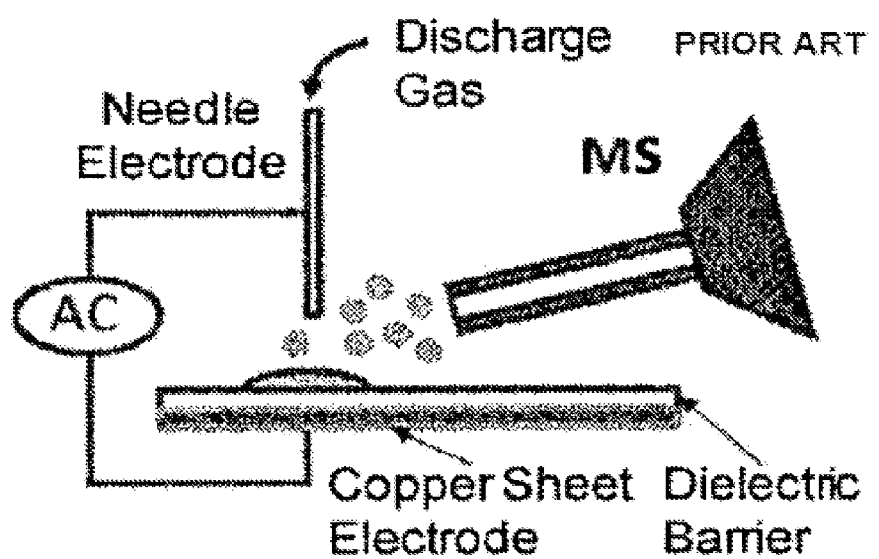
FIG. 3 is a drawing depicting a prior art plasma probe and a mass spectrometer.
Figure 4:
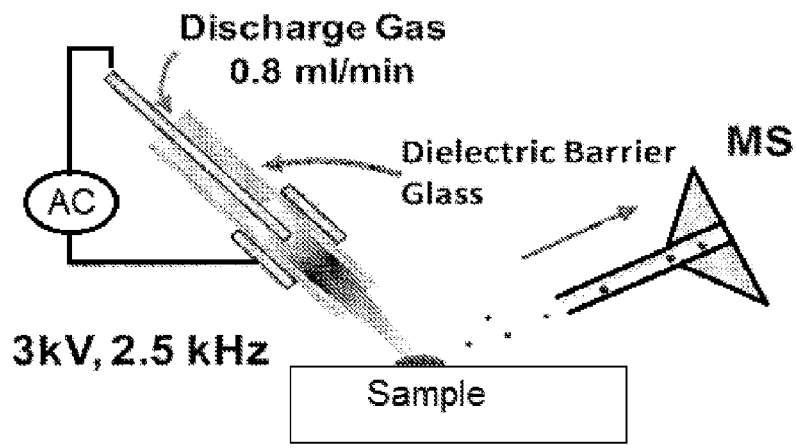
FIG. 4 is a drawing depicting a configuration of the LTP probe of the present invention and a mass spectrometer.

Additionally, other LTP sources (FIG. 3) were compared to the LTP probe of the invention herein (FIG. 4). A difference between the LTP probe of the invention and other plasma sources is the location where ionization and desorption of a sample occurs. In other LTP sources, samples are ionized and desorbed inside the discharging region (FIG. 3), while ionization and desorption with the LTP probe of the present invention occurs outside the discharging region (FIG. 4). The oscillating electric field and the intensity of the primary ionic species were very different, depending on which LTP source was utilized.

Example 4

Explosives

Figure 5A:
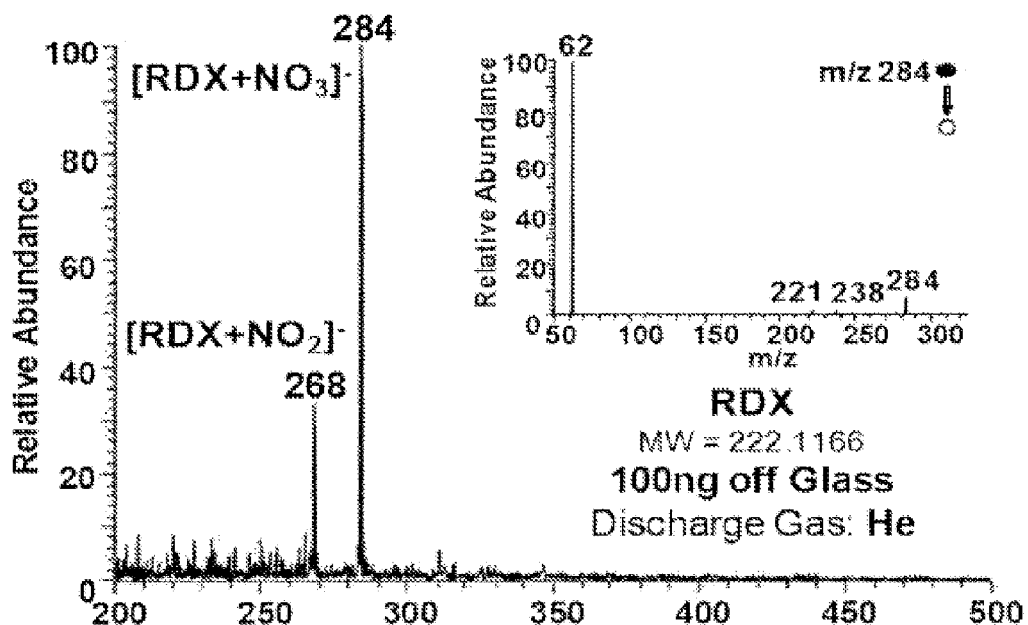
FIGS. 5A and 5B are depictions of mass spectra of 100 ng RDX on a glass surface ionized using the LTP probe of the present invention and different discharge gases.
Figure 5B:
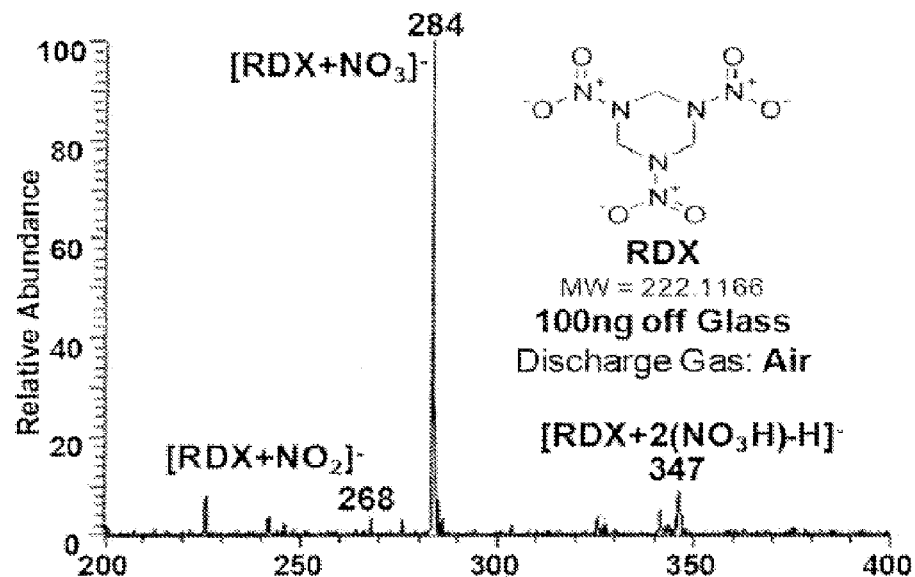
Figure 5C:
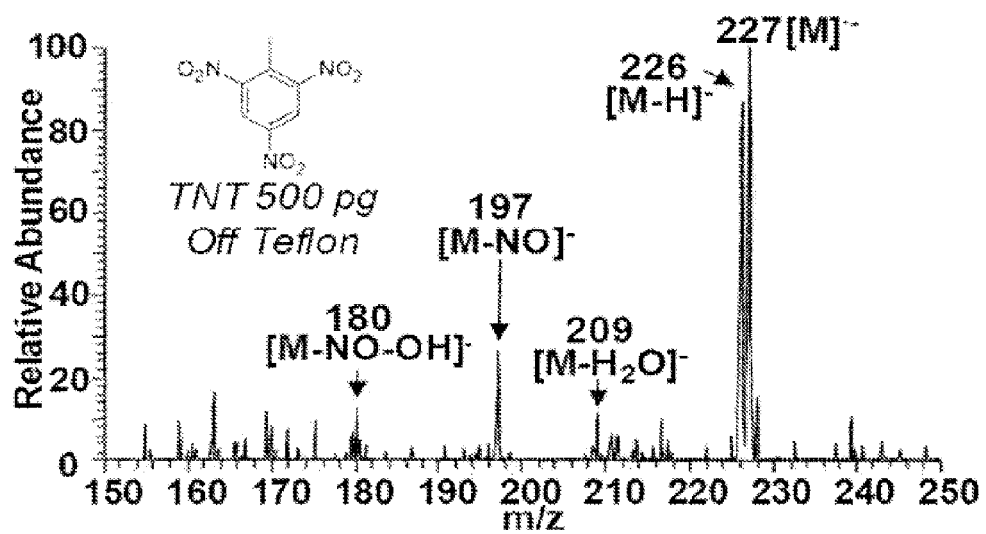
FIGS. 5C-5E are depictions of mass spectra of TNT on a PTFE surface ionized using the LTP probe.
Figure 5D:
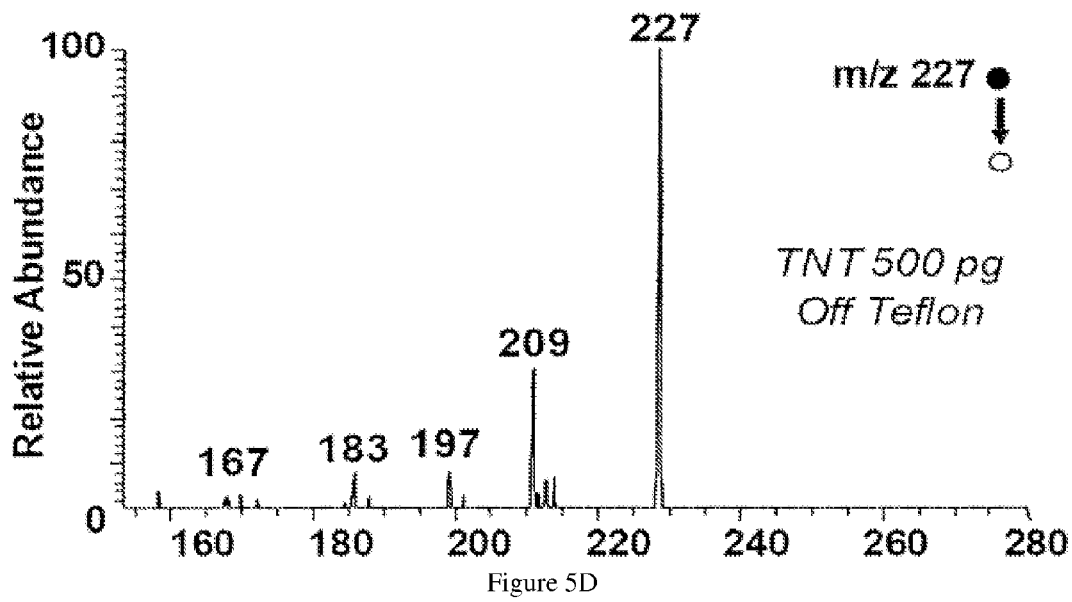
Figure 5E:
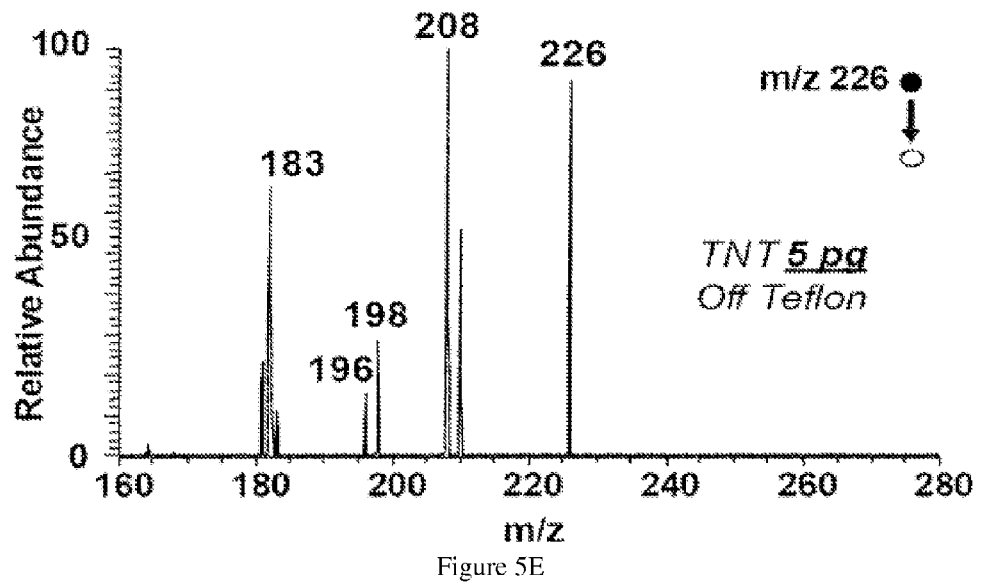

Trace analysis of explosives is important to public safety, and is challenging in that trace in-situ analysis is required. Direct detection of solid explosives from surfaces using the LTP probe was demonstrated in the cases of hexahydro-1,3, 5-trinitro-1,3,5-triazine (RDX) and 2,4,6-trinitrotoluene (TNT) on PTFE and glass surfaces performing mass analysis in the negative ion mode. The RDX sample surface was prepared by spotting a 5 methanol solution containing 100 ng RDX onto a 12 $mm^2$ area of a glass microscope slides and allowing it to dry. The mass spectra recorded in the negative ion mode using the LTP probe with He and air as the discharge gas are shown in FIGS. 5A and B, respectively. Adduct ions $[MH+NO_3]^-$ (m/z 284) and $[M+NO_2]^-$ (m/z 268) were observed with He as the discharge gas, while both adduct ions with $NO_3$ and $NO_2$ were observed with air as well as the adduct ion $[M+2(NO_3H)—H]^-$ (m/z 347). The TNT sample was prepared by spotting a 0.5 μL MeOH solution containing 500 pg TNT onto a PTFE surface, so as to cover an area of about 2 $mm^2$ after drying. Mass spectra with good signal-to-noise ratios were recorded for the negatively-charged ions desorbed using the LTP probe (FIG. 5C). Both the radical ion (m/z 227) and the deprotonated (m/z 226) molecule were present along with fragment ions $[M-H_2O]^-$ (m/z 209), $[M-NO]^-$ (m/z 197) and $[M-NO—OH]^-$ (m/z 180). The $MS^2$ spectrum was recorded for the radical ion m/z 227 to confirm the assigned chemical structure (FIG. 5D). Limits of detection for TNT were determined to be as low as 5 pg on glass or PTFE surfaces in the $MS^2$ mode (FIG. 5E), which is comparable to the value achieved in DESI experiments.

Example 5

Fragmentation Control

In comparison with desorption methods using sprayed charged droplets, significant fragmentation is often observed for desorption using methods involving gaseous discharges. In some of these methods, this is because the sample is routinely heated to enhance ionization. Fragmentation complicates the mass spectra of mixtures so is generally undesirable; however, it can be produced as needed by using tandem mass spectrometry.

Figure 5F:
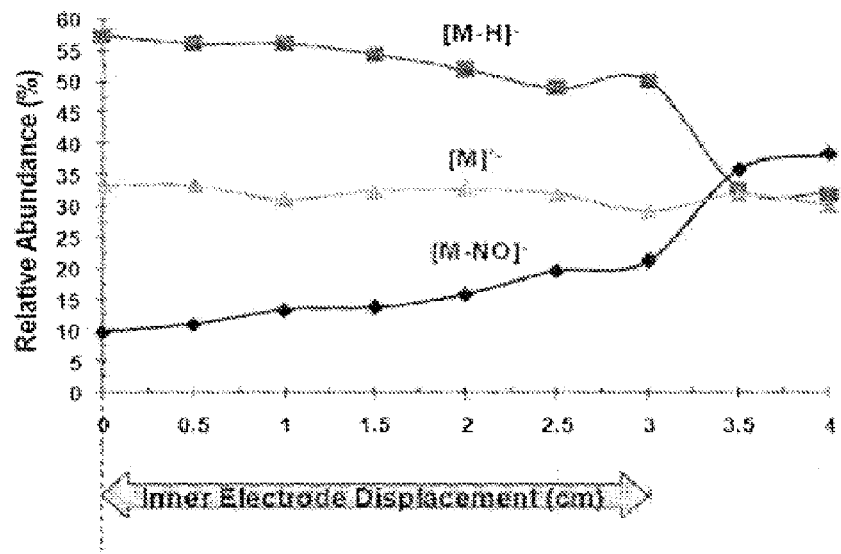
FIG. 5F shows adjustment of the degree of fragmentation by varying the center electrode position.

Using the LTP probe, fragmentation is normally minimal. It was found that the extent of the fragmentation could be adjusted effectively by adjusting the electric field along the tube axis. A series of spectra was recorded for TNT while the center electrode was moved along the tube axis. The intensities of the radical molecular ion $M^{*-}$ (m/z 227), the deprotonated molecule $[M-O]^-$ (m/z 226) and the fragment ion $[M-NO]^-$ (m/z 197), plotted as a function of displacement with respect to the center electrode are shown in FIG. 5F.

It was observed that as the distance between the front ends of the central and high voltage electrodes was increased, the intensity of the deprotonated molecule $[M-H]^-$ (m/z 226) decreased while the intensity of the fragment ion $[M-NO]^{-1}$ (m/z 197) increased. As the center electrode was displaced farther from the high voltage electrode, the electric field component along the tube axis increased, which resulted in an increase in the maximum accelerating field for the ionic species in the plasma and hence to more energetic fragmentation of the analyte molecules during desorption. The ease of adjustment of fragmentation during desorption ionization was an advantage for identifying unknown analytes by chemical structure confirmation, especially when mass spectrometers without tandem mass spectrometry capability were used. With tandem mass spectrometers, it was convenient to ionize gently and to use tandem mass spectrometry to produce fragmentation when and to the extent needed.

Example 6

Desorption Ionization from Liquids and Large Area Surfaces

Desorption of samples directly from the condensed phase and generation of molecular ions in the gas phase in the ambient environment is important for chemical analysis using mass spectrometry. Desorption and ionization using LTP desorption/ionization devices for solid compounds from various surfaces has been demonstrated, including nonvolatile organic compounds, amino acids and lipids from glass, paper or TEFLON, etc. Due to the low temperature of the LTP probe, the extracted torch from the LTP can be used for desorption of chemicals directly from human skin, as is shown in Examples below.

Figure 6:
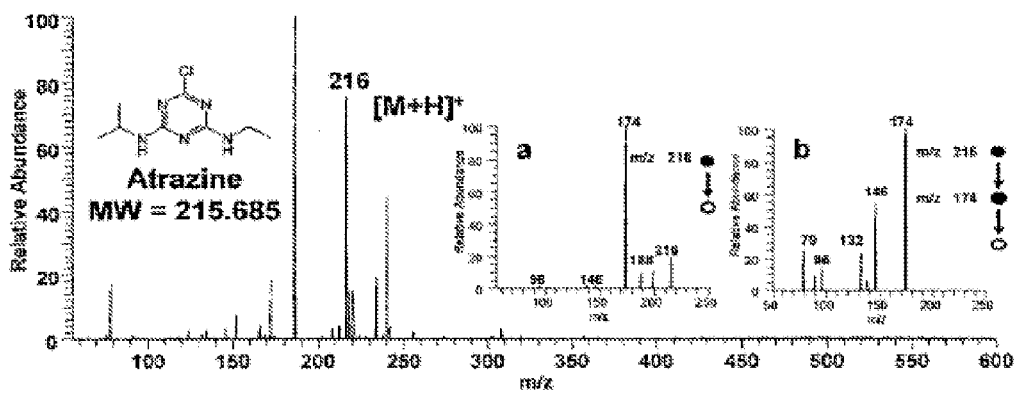
FIG. 6 is a mass spectrum of atrazine spiked into deionized water (100 ppb) and examined in the solution state. The LTP probe using helium as the discharge gas produced the protonated molecular ion (m/z 216).
Figure 7:
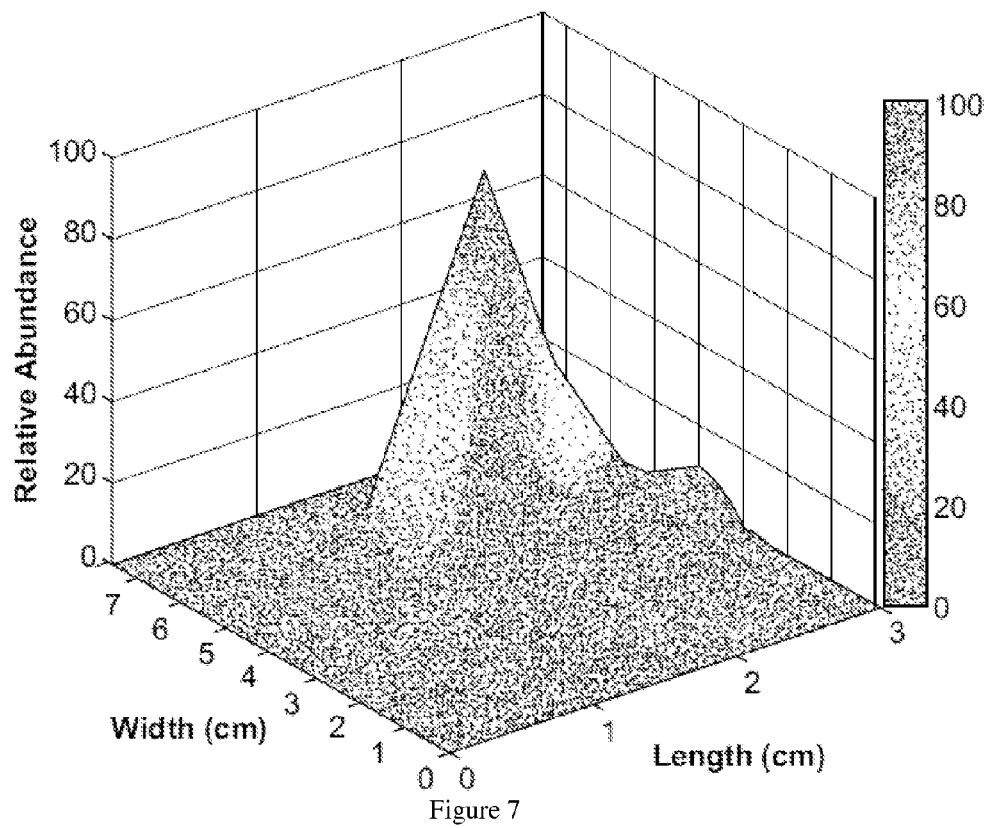
FIG. 7 is a graph showing results of large area sampling using the LTP probes of the invention. The data shows the intensity of m/z 304 as a function of the position of 1 μg of cocaine (distance of approximately 2 mm) on TEFLON.

Direct desorption of chemicals in molecular form from bulk aqueous solutions was achieved using the LTP probe (FIG. 6). The LTP probe was able to desorb and ionize atrazine from water, the mass spectrum of which is shown in FIG. 6. It was also observed that the LTP probes of the invention were capable of large area sampling. Using a LTP probe with a LTQ mass spectrometer, which has a 550 μm diameter opening inlet, analytes on a surface area larger than 20 $cm^2$ were desorbed, ionized and detected by the LTQ. FIG. 7 is a graph showing results of large area sampling using the LTP probes of the invention. The data show an intensity of m/z 304 as a function of the position of 1 μg of cocaine (distance of approximately 2 mm) on TEFLON.

This feature of the LTP probe is an advantage when it is applied for fast screening as is desired in many applications, such as luggage scanning for homeland security purposes, and also allows the development of new methods of performing heterogeneous ionic reactions to be discussed later in this proposal.

Example 7

Ionic Reactions by LTP Desorption

Figure 8:
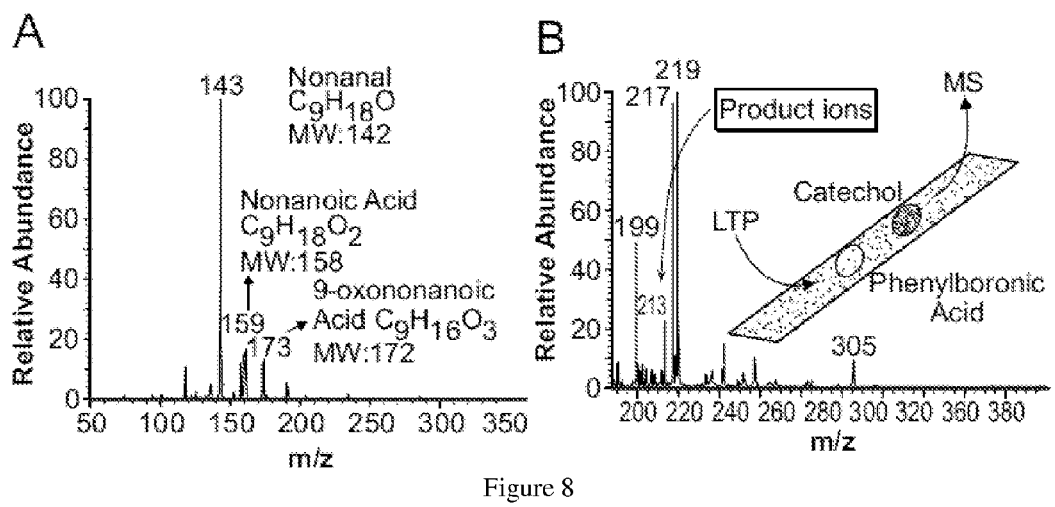
FIG. 8, panel A is a mass spectrum showing oleic acid desorbed from glass using an LTP probe of the invention with He as the discharge gas.

The LTP at atmospheric pressure serves as a rich source of highly reactive species (or for the preparation of active surfaces), that can be used to probe gas phase ion chemistry or to develop new reactions. FIG. 8, panel A shows reactions during the desorption of oleic acid (unsaturated fatty acid, 18:1, cis-9) from TEFLON. Abundant fragment ions, such as nonanal ($C_8H_{18}O$, 143 m/z) and nonanoic acid ($C_8H_{18}O_2$, m/z 159) corresponding to the cleavage at the double bond, were observed due to the reactions with ozone. This type of reaction was found to be extremely useful to identify double bond locations in lipids. The ozonolysis of lipids observed suggested that an oxidative environment was generated during the LTP desorption.

The capability of desorption over a large area by LTP allowed a complexation reaction between benzeneboronate anions ($PhB(OH)_3$) and cis-diol to be conducted by simultaneous desorption of phenylboronic acid and catechol spotted 1 cm apart on a glass surface (FIG. 8, panel B). The cyclic boronates at m/z 213 can be clearly seen (FIG. 8, panel B). Data herein show that chemicals difficult to ionization by common means such as ESI or APCI, can be desorbed and used for gas phase reactions.

The ability to control the LTP chemical environment provides capabilities to implement conditions desirable for particular reaction studies. Efficient chemical desorption capabilities and surface activation will also allow a significant extension to the means of conducting reactions.

Example 8

Methyl Salicylate ($C_8H_8O_3$)

Figure 2B:
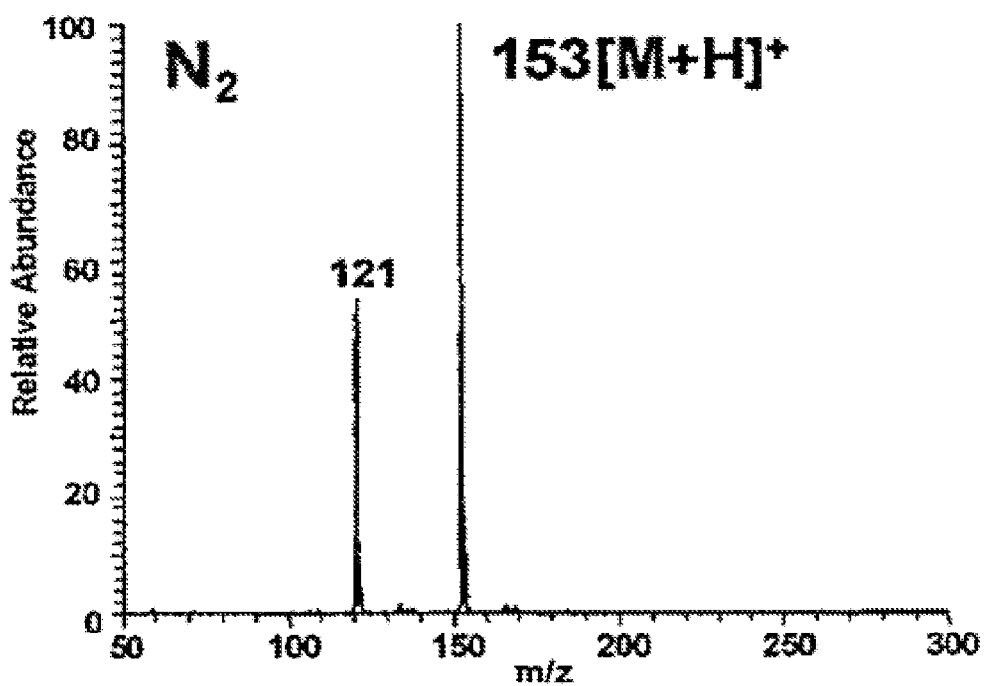
Figure 2C:
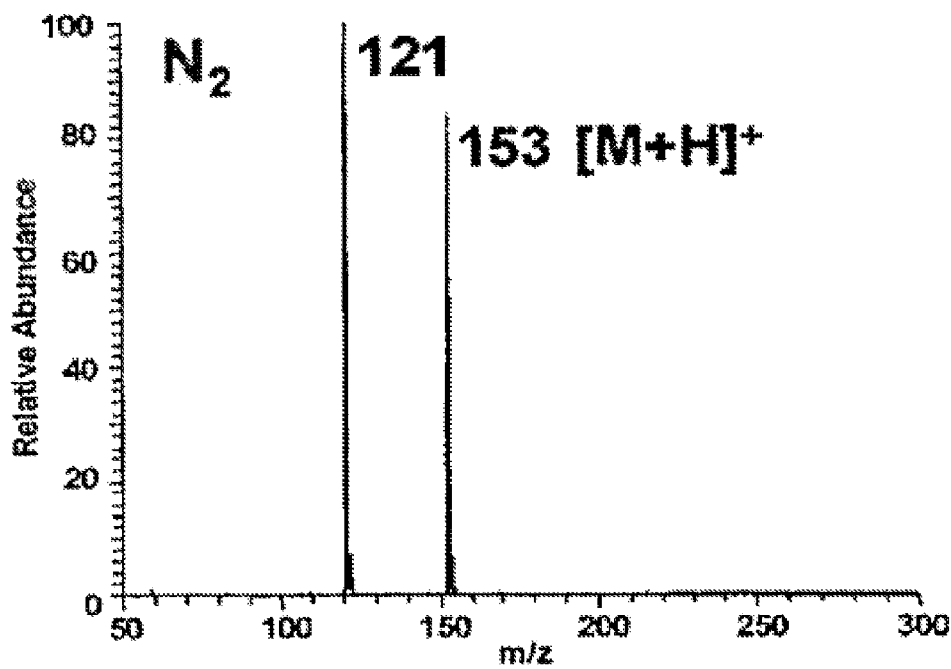
FIG. 2C shows a mass spectrum generated with an increased distance between electrodes.

Methyl salicylate ($C_8H_8O_3$) is a common chemical warfare agent stimulant. To demonstrate the ability of LTP probes of the invention to be used to ionize gas phase molecules, a vial containing 1 mL of methyl salicylate was opened and immediately closed allowing an adequate amount of the highly volatile molecule to be mixed with the ambient air. Methyl salicylate was analyzed via the LTP probe. FIG. 2 shows the positive mass spectrum of methyl salicylate. The LTP probe was turned on and immediately produced the intense protonated molecular ion of m/z 153.

Example 9

Desorption from Human Skin by the LTP Probe

Figure 9:
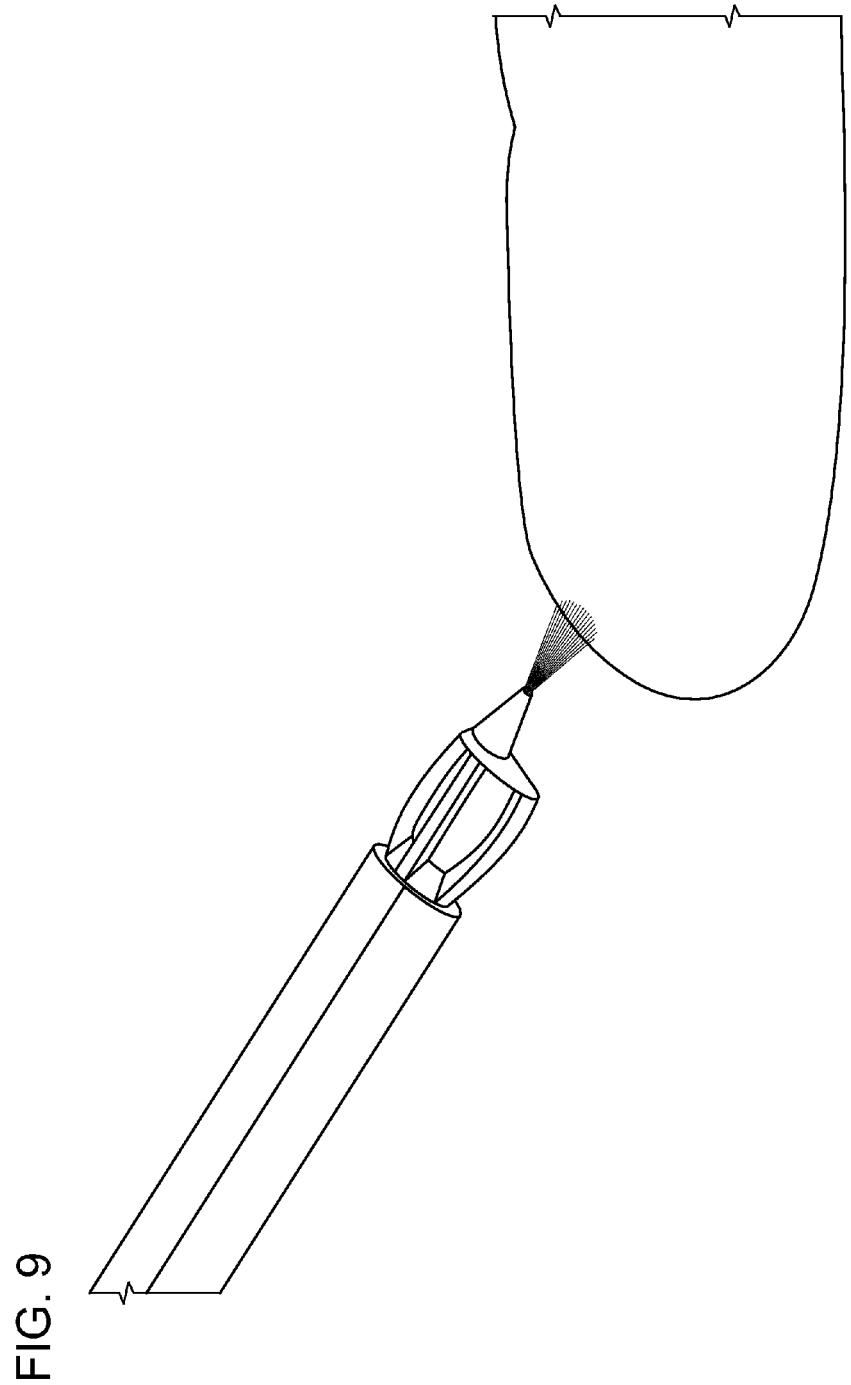
FIG. 9 is a picture depicting an LTP probe of the present invention analyzing compounds on a human finger (compressed air is the discharge gas).

A feature of the LTP probes of the invention is the that the probe operates at low temperature (e.g. 15° C. to 35° C.) and the discharge occurs inside the probe, allowing the plasma to be in contact with human skin without a perceptible shock (FIG. 9). The LTP probe can utilize any type of discharge gas including air, which is highly desirable for portable chemical detection systems.

Figure 10:
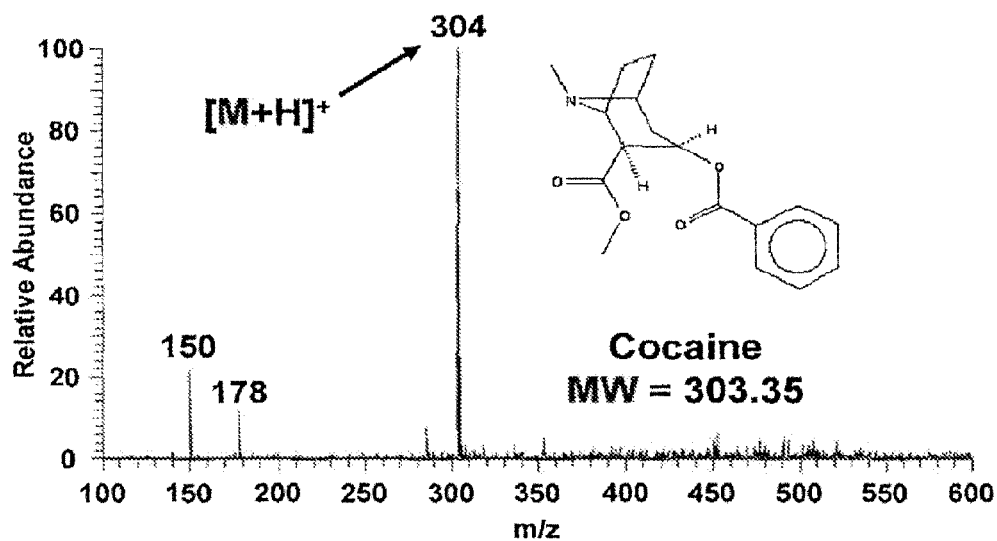
FIG. 10 is a mass spectrum of cocaine (1 μg), detected from human skin directly using an LTP probe of the invention with compressed air as the discharge gas. The compound is detected as the protonated molecular ion (m/z 304). Non-analyte peaks (m/z 150 and 78) correspond to other compounds on the figure.

To demonstrate these features of the LTP probe, cocaine was ionized and desorbed from human skin using compressed air as the discharge gas (FIG. 9). Cocaine ($C_{17}H_{21}NO_4$) was dissolved in methyl alcohol (MeOH) resulting in a solution of 1 mg/ml. The cocaine/MeOH mixture was spotted onto a human finger (1 μg/1 μL). The cocaine/MeOH mixture was allowed to dry on the skin and the LTP probe was used to ionize and desorb the cocaine from the skin. The LTP probe was able to ionize and desorb the protonated molecular ion of cocaine from skin with no heating of the skin or shocking of the subject (FIG. 10).

Example 10

CLARITIN and DIFLUCAN

To show that the LTP probe can also be used to analyze pharmaceutical tablets, the over the counter antihistamine CLARITIN (Schering-Plough) and prescription antifungal agent DIFLUCAN (Pfizer) were analyzed using the LTP probe with no pre-treatment besides removing a thin covering layer of the tablet to expose the active ingredients. The tablets were placed on the xy moving stage where the LTP probe (He discharge gas) desorbed and ionized the intact tablets for analysis with the mass spectrometer. CLARITIN tablets contained 10 mg of the active ingredient Loratadine, and DIFLUCAN tablets contained 25 mg of the active ingredient fluconazole.

Figure 11:
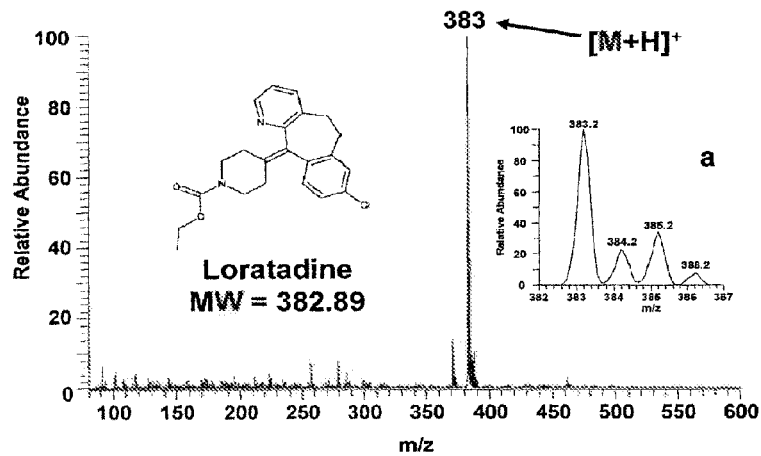
FIG. 11 is a mass spectrum of an intact CLARITIN tablet (active ingredient: Loratadine, chemical average molecular weight 382.89) analyzed using the LTP probe (He discharge gas) resulting in the protonated molecular ion m/z 383 and its isotopes. Panel A shows the characteristic chlorine isotopic signature of CLARITIN.
Figure 15:
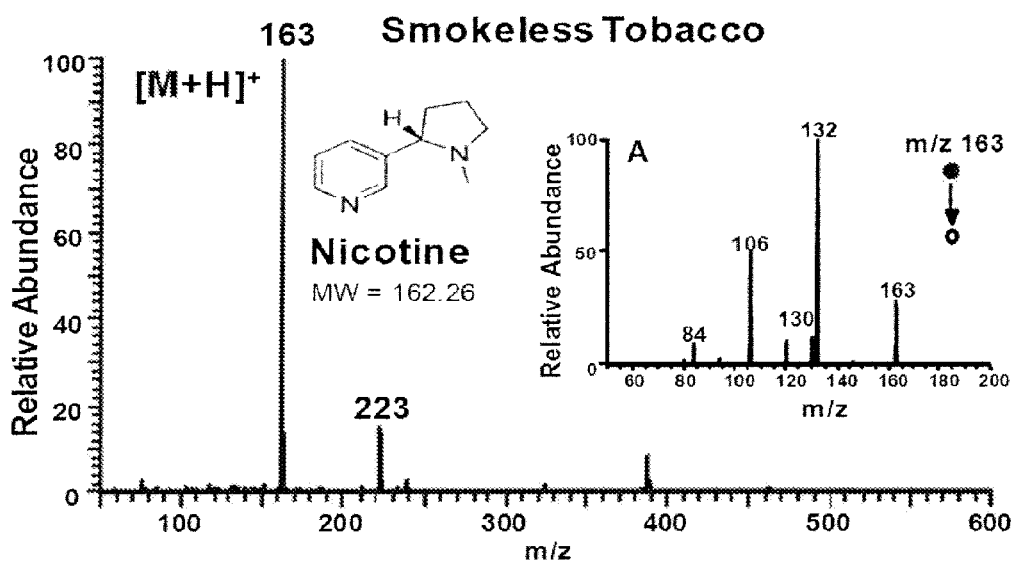
FIG. 15 is a mass spectrum of nicotine (250 mg). The LTP probe produced the protonated molecular ion (m/z 163).

FIG. 11 shows the positive mass spectrum of an intact CLARITIN tablet obtained using the LTP probe. The protonated molecular ion (m/z 383) was observed in the mass spectrum with high intensity. The positive ion DESI mass spectra of a CLARITIN tablet has been reported using a LTQ (Thermo Finnigan, San Jose, Calif., USA) mass spectrometer and a prototype Orbitrap mass spectrometer (Thermo Finnigan, San Jose, Calif., USA; Qizhi Hu, N. T., Robert J. Noll, R. Graham Cooks, Rapid Communications in Mass Spectrometry 2006, 20, 3403-3408). Tandem mass spectrometry was performed on the protonated ion (m/z 383) to confirm its identity as Loratidine, fragmentation resulting in m/z 337 by loss of $CH_3CH_2OH$ from the ethyl ester side chain and matching $MS^2$ data previously reported. FIG. 15, panel A shows the characteristic chlorine isotopic signature Of CLARITIN, matching DESI-MS data obtained for CLARITIN using an Orbitrap mass spectrometer.

Figure 12:
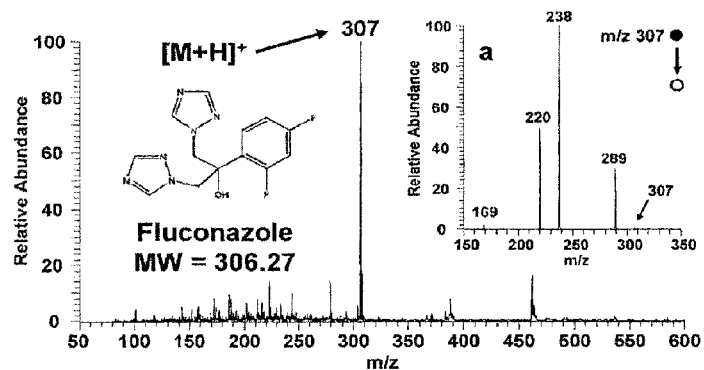
FIG. 12 is a mass spectrum of an intact DIFLUCAN tablet (active ingredient: Fluconazole) analyzed using the LTP probe (He discharge gas) resulting in the protonated molecular ion m/z 307. Panel A shows tandem MS data confirming molecular identity.

FIG. 12 shows the positive mass spectrum of an intact DIFLUCAN tablet obtained using the LTP probe. The protonated molecular ion (m/z 307) was observed (FIG. 16). Tandem mass spectrometry performed via CID (FIG. 16, panel A) confirmed identity of DIFLUCAN, and is very similar to prior reports of fluconazole electrospray ionization MS/MS data (Christine M. Thompson, D. S. R., Sally-Ann Fancy, George L. Perkins, Frank S. Pullen, Catriona Thom, Rapid Communications in Mass Spectromeny 2003, 17, 2804-2808). Loss of water ($H_2O$) from the molecular ion results in a fragment of m/z 289, while loss of s-triazole ($C_2H_3N_3$) results in m/z 238. The product ion m/z 220 occurred with the loss of s-triazole ($C_2H_3N_3$) from the m/z 289 product ion, while the loss of two s-triazole molecules (($C_2H_3N_3)_2$) from the m/z 289 product ion resulted in the m/z 169 product ion.

Example 11

Atrazine

The LTP probes of the invention can ionize and desorb analytes directly from liquid surfaces. Deionized water was spiked with the pesticide atrazine at a concentration of 100 parts-per-billion and 50 μL of the liquid spiked deionized water was placed in a small plastic vial cap. The vial cap containing the liquid spiked water was placed on an xy table, and using the LTP probe (He discharge gas) was analyzed for trace detection of atrazine. The protonated molecular ion of atrazine (m/z 216, FIG. 6) was isolated, and $MS^2$ and $MS^3$ was each performed via CID (FIG. 6, panels A and B). The relative intensity of the highest background peak was two orders of magnitude lower than the analyte.

Example 12

Aspartic Acid

Figure 13:
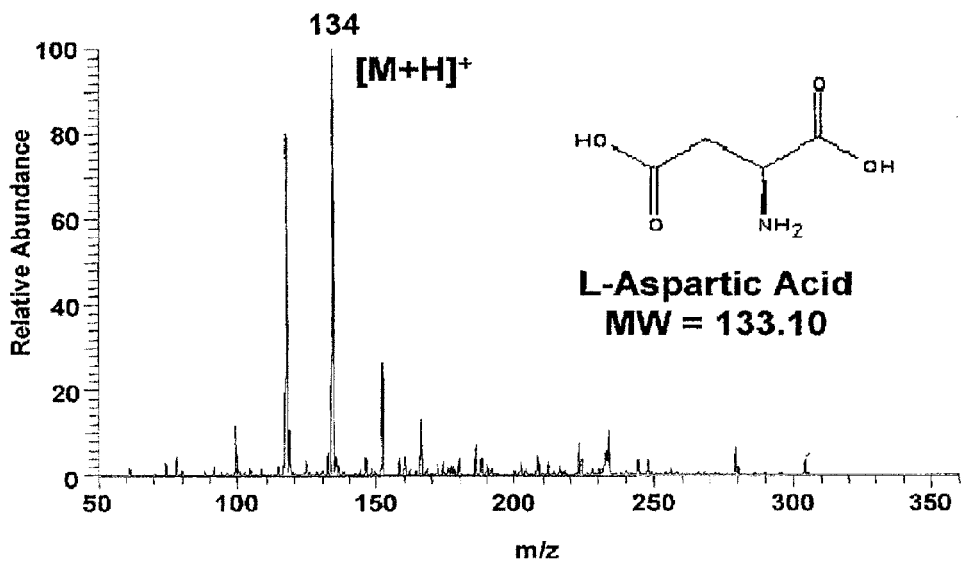
FIG. 13 is a mass spectrum of the amino acid L-Aspartic Acid (5 μg) spotted on a TEFLON surface. The protonated molecular ion (m/z 134) was detected using the LTP probe (He discharge gas).

The LTP probes of the invention can ionize and desorb amino acids, proteins, and peptides. FIG. 13 is a mass spectrum of the amino acid L-Aspartic Acid (5 μg) that was spotted on a TEFLON surface. The protonated molecular ion (m/z 134) was detected using the LTP probe (He discharge gas).

Example 13

Complex Matrices

The capability of the LTP probe to analyze samples in complex matrices has been further demonstrated by examination of the stomach contents of a deceased dog, suspected to have died from ingestion of an insecticide. Without any sample workup, extraction or separation, a small amount (about 1 g) of stomach contents were placed on a glass slide and analyzed directly via the LTP probe with $N_2$ as the discharge gas. Mass spectra of the stomach contents (FIG. 14, panel A) clearly show the protonated molecule Terbufos (m/z 289) and Terbufos sulfoxide (m/z 305), two active chemicals in common Terbufos-based insecticides.

Figure 14:
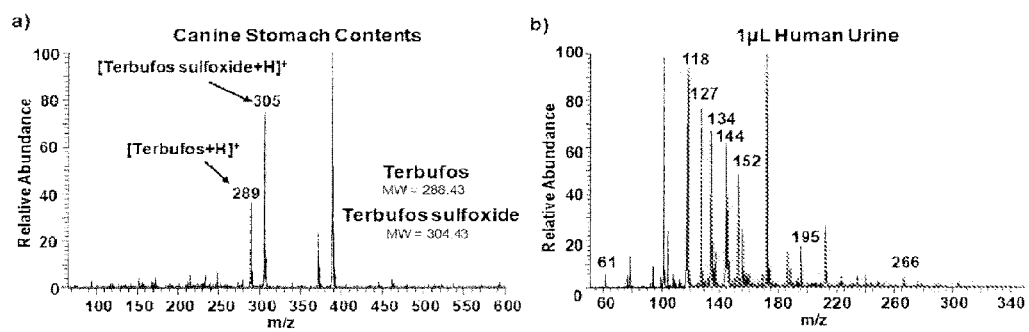
FIG. 14, panels A and B are mass spectra showing analysis of complex mixtures. Panel A is a mass spectrum of the stomach content of a deceased canine. Panel B is a mass spectrum of raw urine (1 μl) dried on a PTFE surface.

Urine is another complex sample. Direct MS analysis of urine using ESI or APCI is usually problematic due to the high concentration of salts and matrix interferences. Using ambient sampling by DESI, patterns of occurrence of metabolites can be quickly acquired from raw urine without pre-treatment. Raw human urine (1 uL) was spotted on a PTFE surface, dried and then analyzed using LTP desorption with He as the discharge gas. A spectrum was recorded in the positive ion mode as shown in FIG. 14, panel B. The peak at m/z 195 corresponds to protonated caffeine. The peaks at m/z 61 and 144 are likely to correspond to urea, and uracil respectively.

Example 14

Nicotine

A small pinch (about 250 mg) of the Copenhagen smokeless tobacco (U.S. Smokeless Tobacco Co., Stamford, Conn., USA) was exposed to the plasma of the LTP probe and the recorded spectra shows an intense signal due to protonated nicotine (m/z 163; FIG. 15). Tandem mass spectrometry experiments were performed by selecting the ion m/z 163 for dissociation and the $MS^2$ spectrum shows the characteristic fragmentation pattern of nicotine (FIG. 15, panel A).

What is claimed is:

1. A low temperature plasma probe, the probe comprising:
a hollow body having an open distal end;
a discharge gas inlet port coupled to the body such that gas may be injected through the port and into the body; and
an electrode at least partially disposed within the body that generates an electric field;
wherein the probe is configured such that injected gas interacts with the electric field to form a low temperature plasma that is ejected from the distal end of the body by the electric field produced by the electrode.

2. The probe according to claim 1, wherein the electrode is axially centered within the distal end of the body.

3. The probe according to claim 1, further comprising a power supply.

4. The probe according to claim 1, further comprising a source of discharge gas operably coupled to the probe via the discharge gas inlet port.

5. The probe according to claim 4, wherein a discharge gas is supplied to the probe through the discharge gas inlet port.

6. The probe according to claim 5, wherein the discharge gas assists in propelling the low temperature plasma out of the probe tip.

7. The probe according to claim 4, wherein the discharge gas is nitrogen.

8. The probe according to claim 1, further comprising a second electrode and a dielectric barrier, wherein the two electrodes are separated by the dielectric barrier.

9. The probe according to claim 8, wherein the dielectric barrier is composed of an electrically insulating material.

10. The probe according to claim 1, wherein the hollow body comprises a tube.

11. A system for analyzing a sample, the system comprising:
a plasma probe, the probe comprising a hollow body having an open distal end; a discharge gas inlet port coupled to the body such that gas may be injected through the port and into the body; and a needle electrode at least partially disposed and axially centered within the distal end of the body, wherein the needle electrode does not protrude from the distal end of the body; wherein the probe is configured such that injected gas interacts with the needle electrode to form a plasma that is ejected from the distal end of the body;
a heating element operably associated with the probe such that a sample is heated during its interaction with the plasma;
a sample stage operably coupled to the probe such that plasma generated by the probe is directed from the probe to interact with the sample on the sample stage; and
a mass analyzer located distal to the sample stage to receive ions generated by the interaction of the plasma from the probe with the sample on the sample stage.

12. The system according to claim 11, further comprising a power supply.

13. The system according to claim 11, further comprising a source of discharge gas operably coupled to the probe via the discharge gas inlet port.

14. The system according to claim 13, wherein a discharge gas is supplied to the probe through the discharge gas inlet port.

15. The system according to claim 14, wherein the discharge gas assists in propelling the plasma out of the probe tip.

16. The system according to claim 13, wherein the discharge gas is nitrogen.

17. The system according to claim 11, further comprising a second electrode and a dielectric barrier, wherein the two electrodes are separated by the dielectric barrier.

18. The system according to claim 17, wherein the dielectric barrier is composed of an electrically insulating material.

19. The system according to claim 11, wherein the hollow body comprises a tube.

* * * * *